(12) United States Patent
Tripodi

(10) Patent No.: US 7,033,568 B2
(45) Date of Patent: Apr. 25, 2006

(54) HIGH $T_C$ PALLADIUM HYDRIDE SUPERCONDUCTOR

(75) Inventor: Paolo Tripodi, 111, Via Calpurnio Pisone, 00175 Rome (IT)

(73) Assignee: Paolo Tripodi, (IT)

( * ) Notice: Subject to any disclaimer, the term of this patent is extended or adjusted under 35 U.S.C. 154(b) by 446 days.

(21) Appl. No.: 10/204,971

(22) PCT Filed: Mar. 12, 2001

(86) PCT No.: PCT/IB01/00915

§ 371 (c)(1),
(2), (4) Date: Aug. 27, 2002

(87) PCT Pub. No.: WO01/67525

PCT Pub. Date: Sep. 13, 2001

(65) Prior Publication Data
US 2003/0144151 A1 Jul. 31, 2003

Related U.S. Application Data

(60) Provisional application No. 60/188,585, filed on Mar. 10, 2000.

(51) Int. Cl.
*C01B 6/00* (2006.01)
*C25D 7/00* (2006.01)
*B05D 5/12* (2006.01)

(52) U.S. Cl. ............... 423/645; 423/647.7; 505/951 B; 205/51; 427/62; 427/255.12

(58) Field of Classification Search ................ 423/645, 423/647.7; 505/100, 110, 810, 951 B; 205/51; 427/62, 255.12
See application file for complete search history.

(56) References Cited

U.S. PATENT DOCUMENTS

4,043,809 A 8/1977 Ruvalds
4,485,152 A 11/1984 Homan et al.

OTHER PUBLICATIONS

Silvera et al (Deuterated palladium..), Physical Review B, 42(14), Nov. 1990, pp 9143-9146.*
Celani et al (Reproducible D/Pd ratio > 1 . . . ), Fusion Technology vol. 29, May 1996, pp 398-404.*
Meyers et al (Superstoichiometry, accelerated diffusion, and nuclear reactions . . . ), Physical Review B, 43(12), Apr. 1991, pp 9503-9512.*

(Continued)

*Primary Examiner*—Mark Kopec
(74) *Attorney, Agent, or Firm*—Fish & Richardson P.C.; John F. Horvath

(57) ABSTRACT

A palladium hydride superconductor, $Pd^yH_x$ where $^yH_x$ is $^1H_x$, $^2H_x$, or $^3H_x$, having a critical temperature $T_c \geq 11K$ and stoichiometric ratio $x \geq 1$. The critical temperature is proportional to a power of the stoichiometric ratio, which is stable over periods exceeding 24 hours, temperature variations from 4K to 400K, and pressures down to 1 mbar. The palladium hydride is coated with a stabilizing material such as a metal, metal oxide, ceramic, or polymer that can bond to palladium. It can be made by electrochemically loading a palladium lattice with isotopic hydrogen in an electrolytic solution, by allowing isotopic hydrogen to diffuse into a palladium thin film in a pressure chamber, or by injecting isotopic hydrogen into a palladium thin film in a vacuum chamber. The stabilizing material can be electrochemically bonded to the surface of the palladium hydride, or deposited using chemical vapor deposition or molecular beam epitaxy.

57 Claims, 14 Drawing Sheets

OTHER PUBLICATIONS

F. Celani et al., "Observations of Strong Resistivity Reduction in a Palladium Thin Long Wire Using Ultra-High Frequency Pulsed Electrolysis at D/Pd> 1", *ICCF-6*, Oct. 13-18, 1996, Japan.

F. Celani et al., High power μs pulsed electrolysis using palladium wires: evidence for a possible "phase" transition under deuterium overloaded conditions and related excess heat, *ICCF5*, Fifth International Conference on Cold Fusion, Apr. 9-13, 1995, Monte Carlo, Monaco.

F. Celani et al., "Study of deuterium charging behaviour in palladium and palladium alloy plates, changing surface treatments, by μs pulsed electrolysis", *ICCF5*, Fifth International Conference on Cold Fusion, Apr. 9-13, 1995, Monte Carlo Monaco.

P. Tripodi et al., "Temperature coefficient of resistivity at compositions approaching PdH", *Physics Letters A, 276*, pp. 122-126, Oct. 30, 2000.

J. G. Bednorz et al., "Possible High $T_c$ Superconductivity in the Ba-La-Cu-O System", *Z Phys.-Condensed Matter 64*, pp. 189-193, 1986.

F. Celani et al., "Deuterium overloading of palladium wires by means of high power μs pulsed electrolysis and electromigration: suggestions of a phase transition and related excess heat"; *Physics Letters A*, vol. 214, No. 1-2, pp. 1-13, May 6, 1996.

T. Skoskiewicz et al., "Isotope effect in the superconducting palladium-hydrogen-deuterium system"; *Journal of Physics C(Solid State Physics)*; vol. 7, No. 15, pp. 2670-2676; Aug. 7, 1974.

C. Bartolomeo, et al.; "Alfred Coehn and after: the alpha, beta, gamma of the palladium-hydrogen system"; Transactions of Fusion Technology, vol. 26, pp. 23-43, Dec. 1994.

J. Kirkwood, PCT International Search Report, PCT/IB 01/00915; Jun. 6, 2002.

* cited by examiner

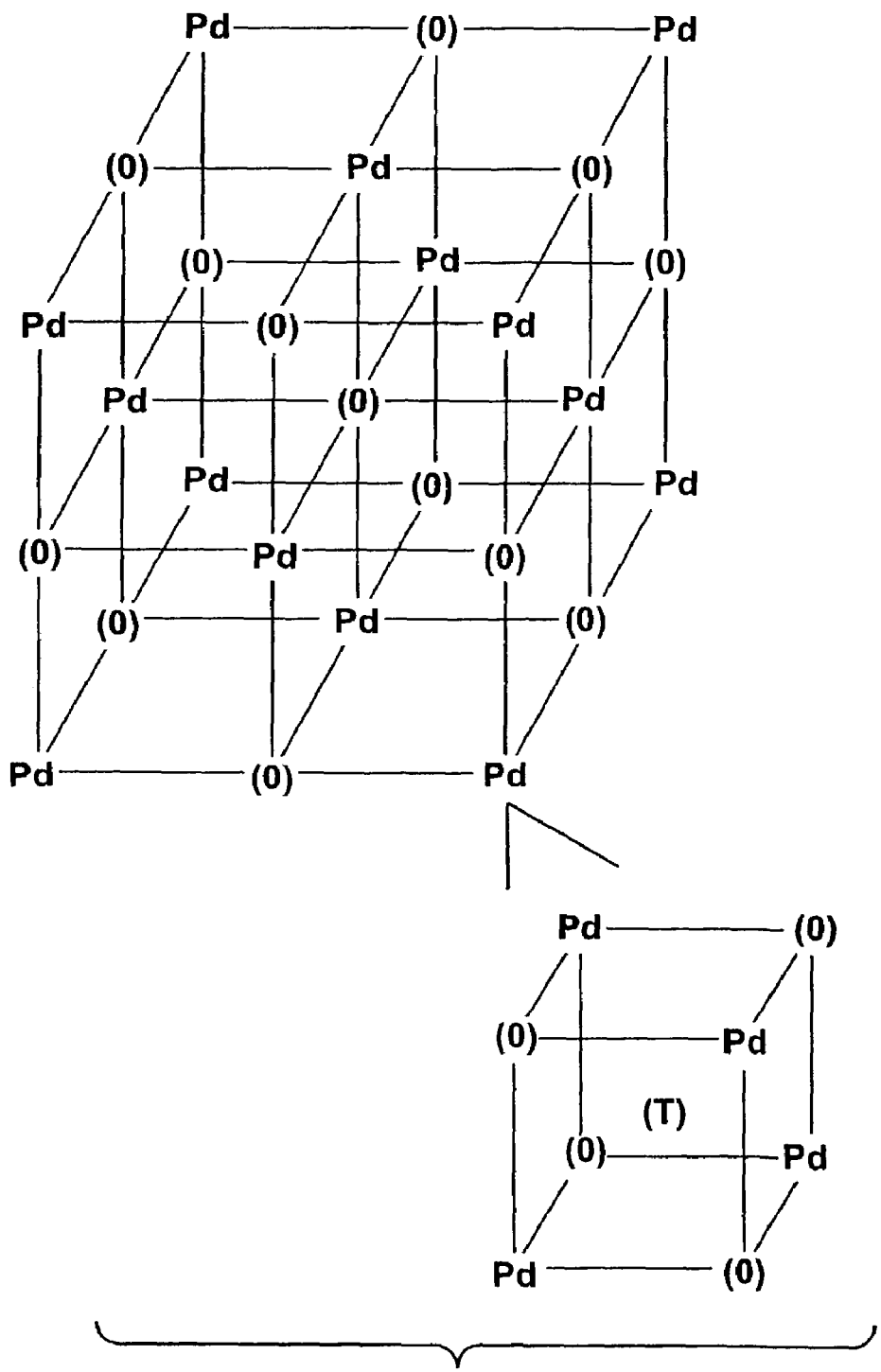
FIG._1

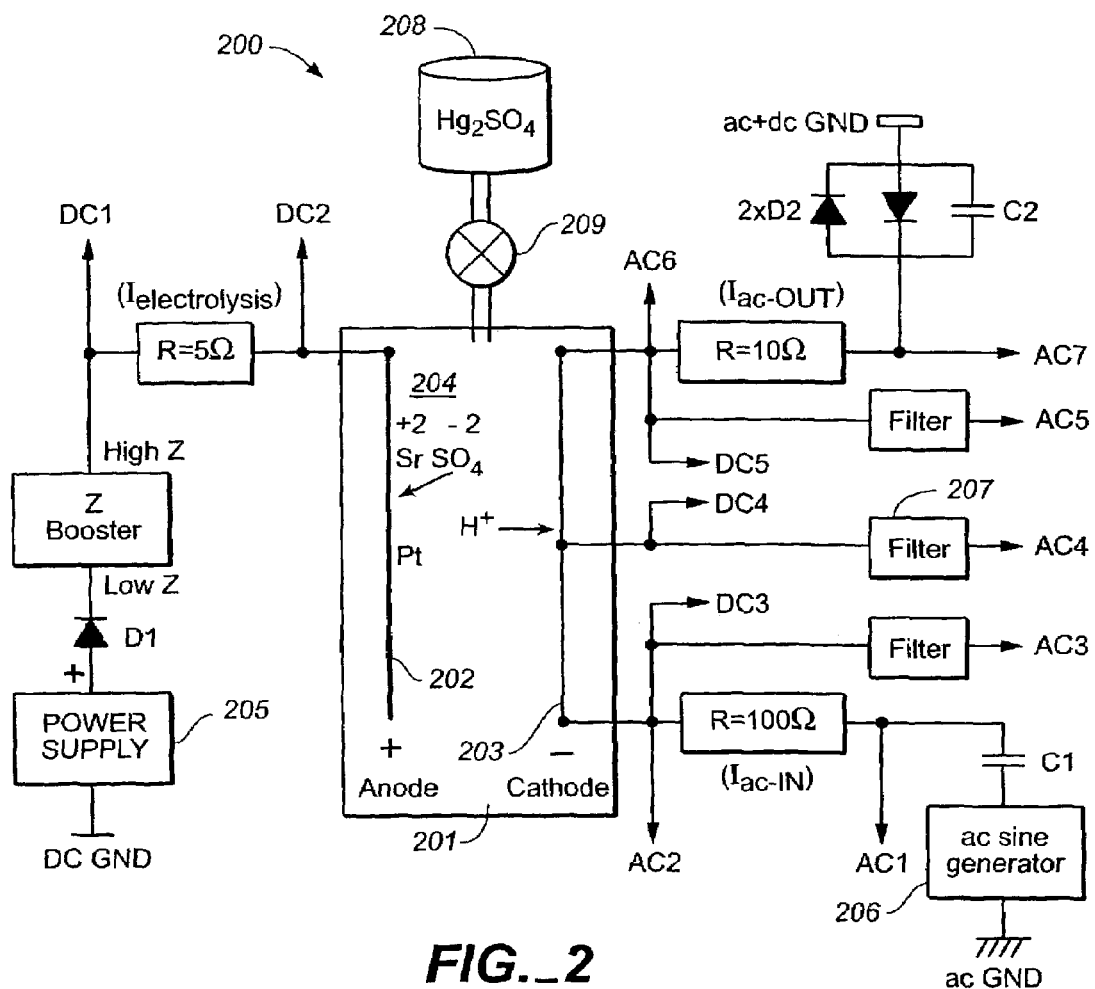
FIG._2

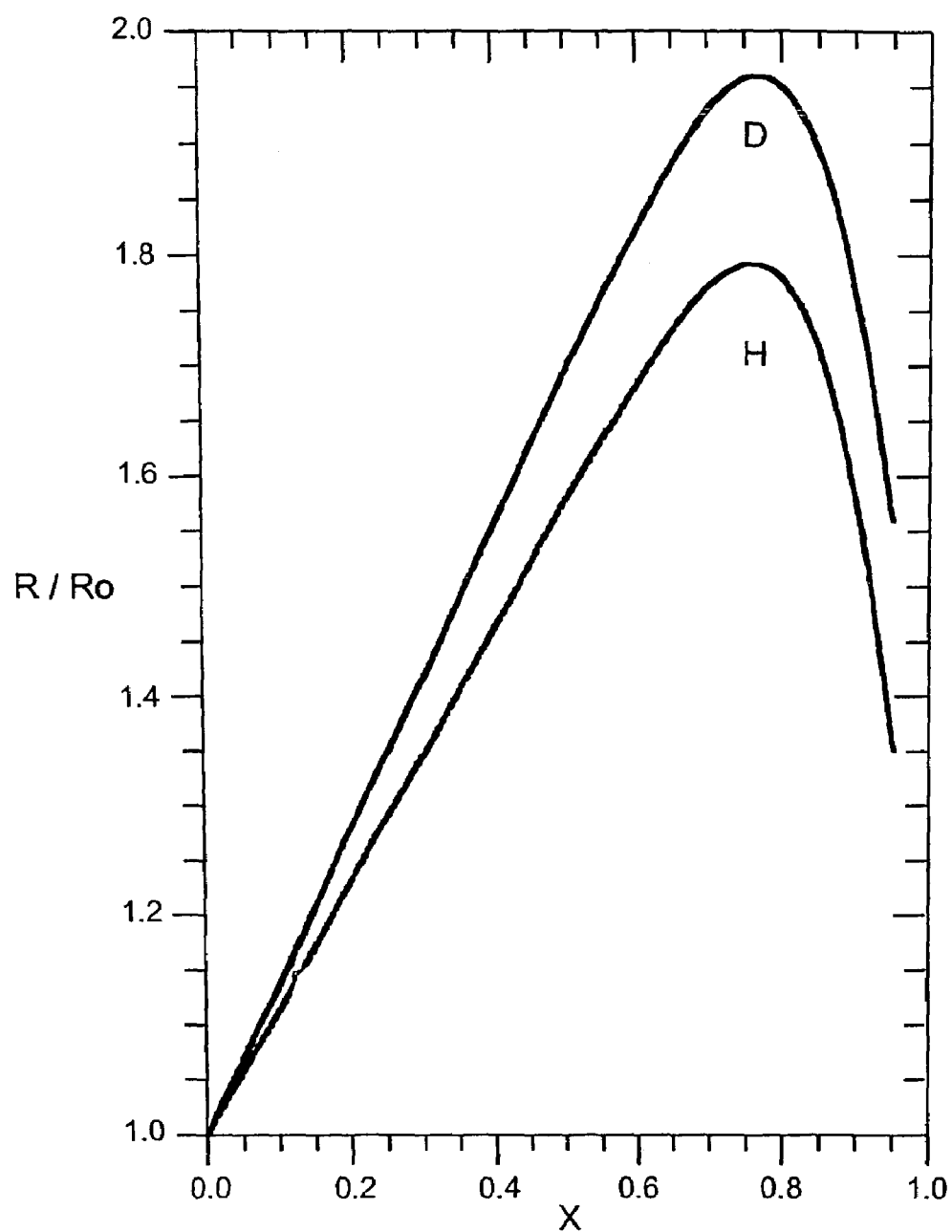
FIG._3
*(PRIOR ART)*

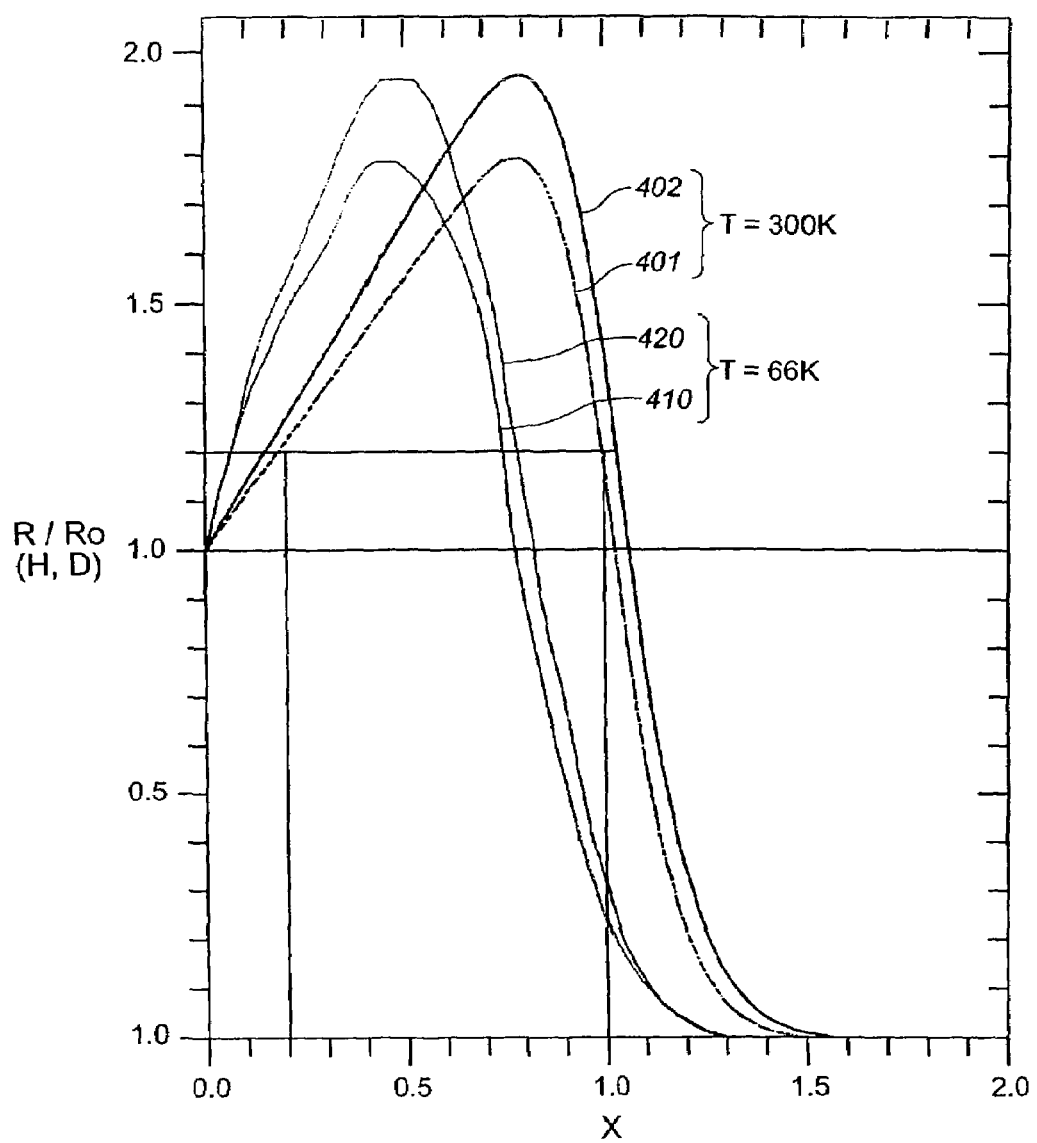
FIG._4

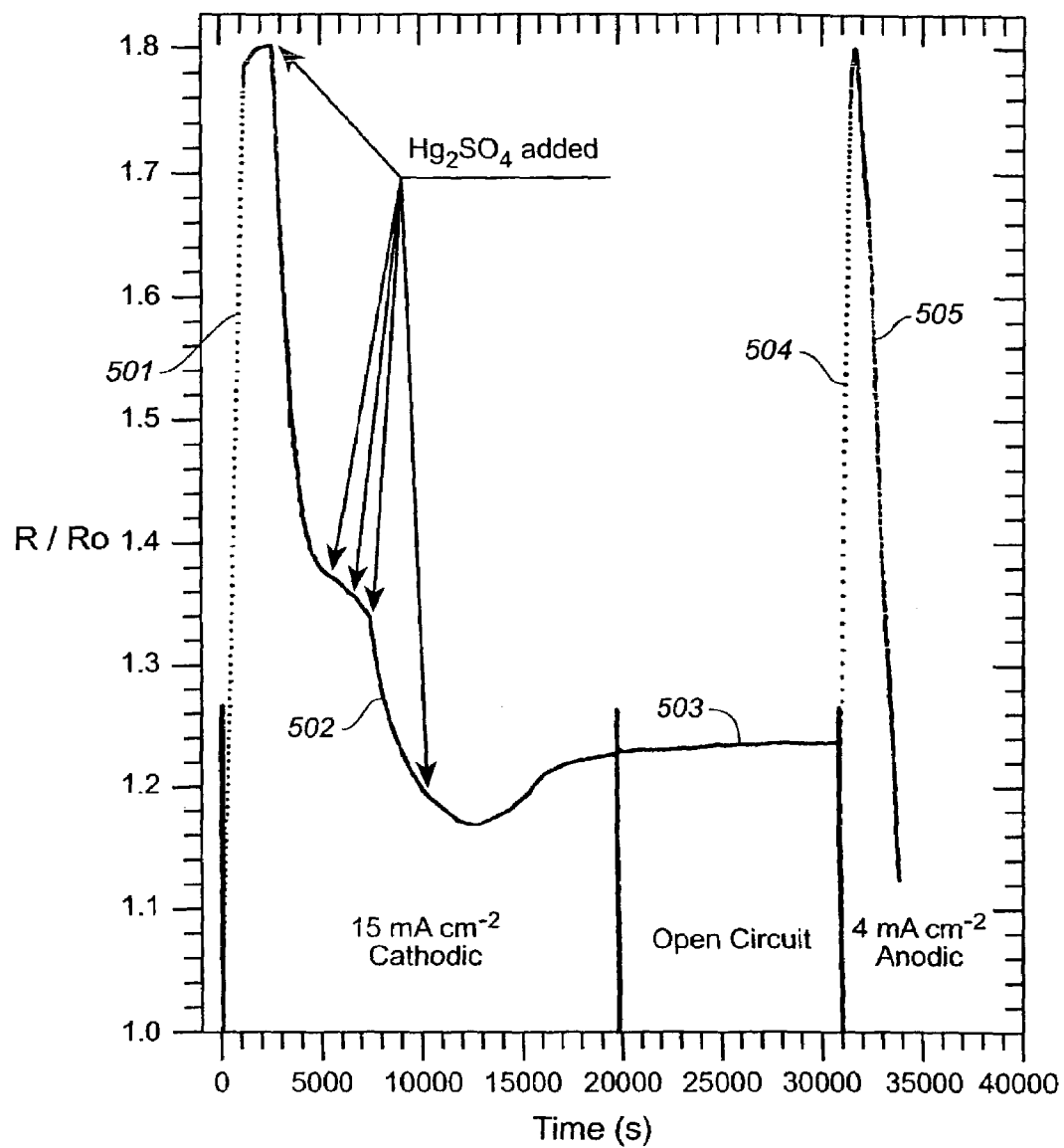
FIG._5

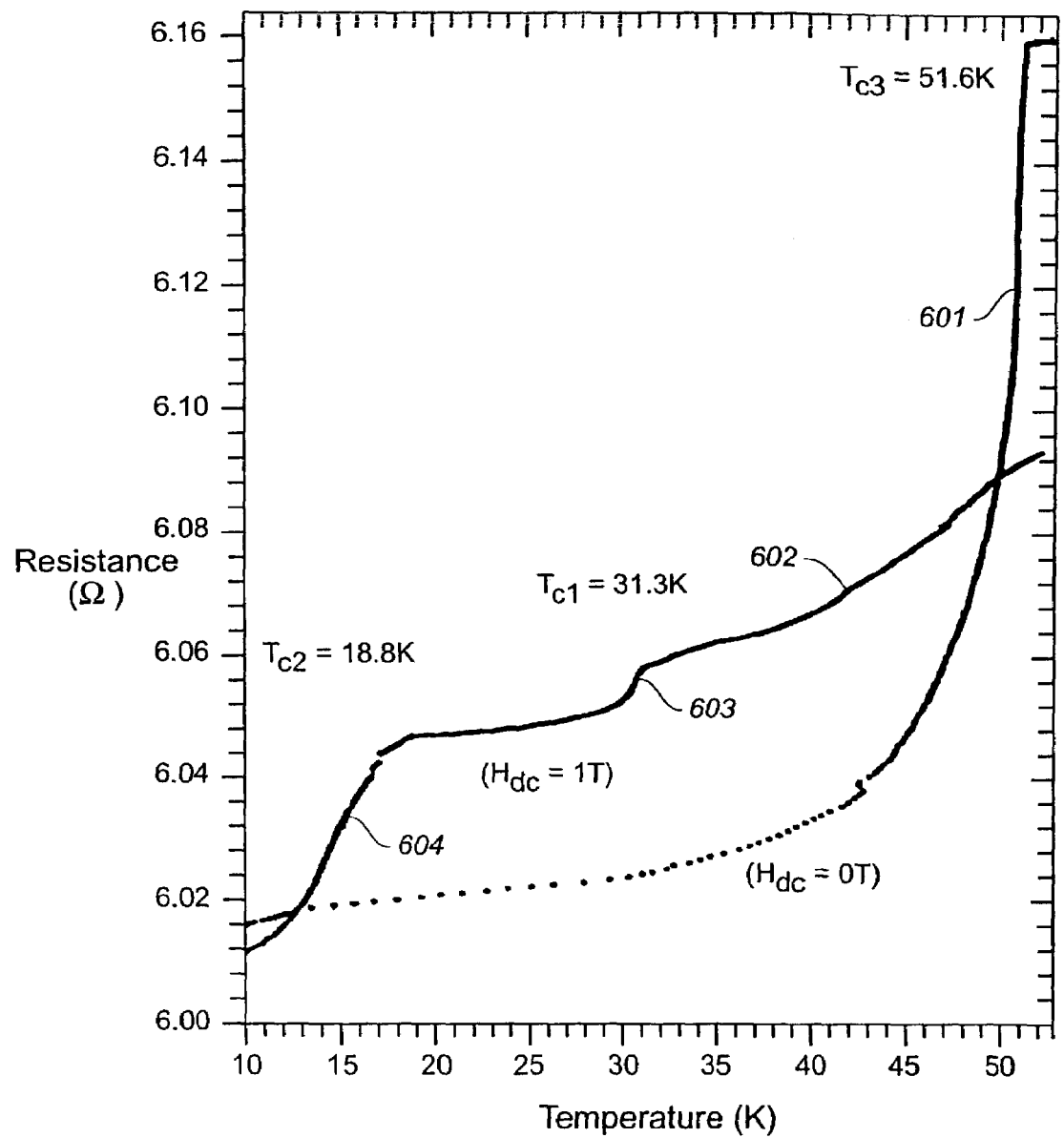
FIG._6

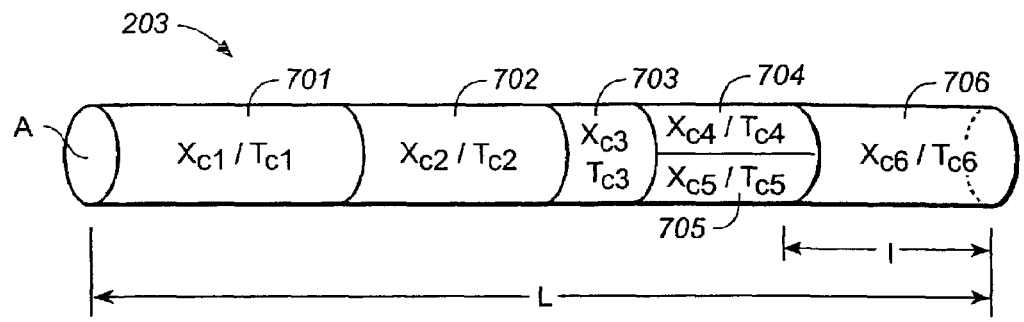
FIG._7
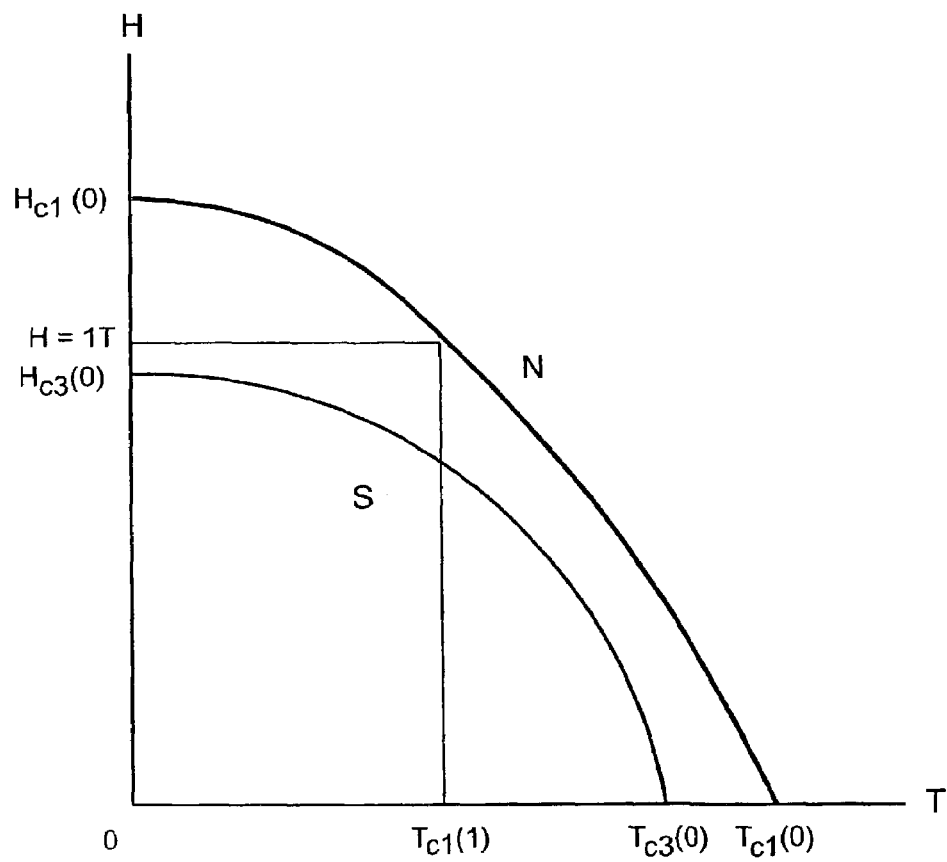
FIG._8

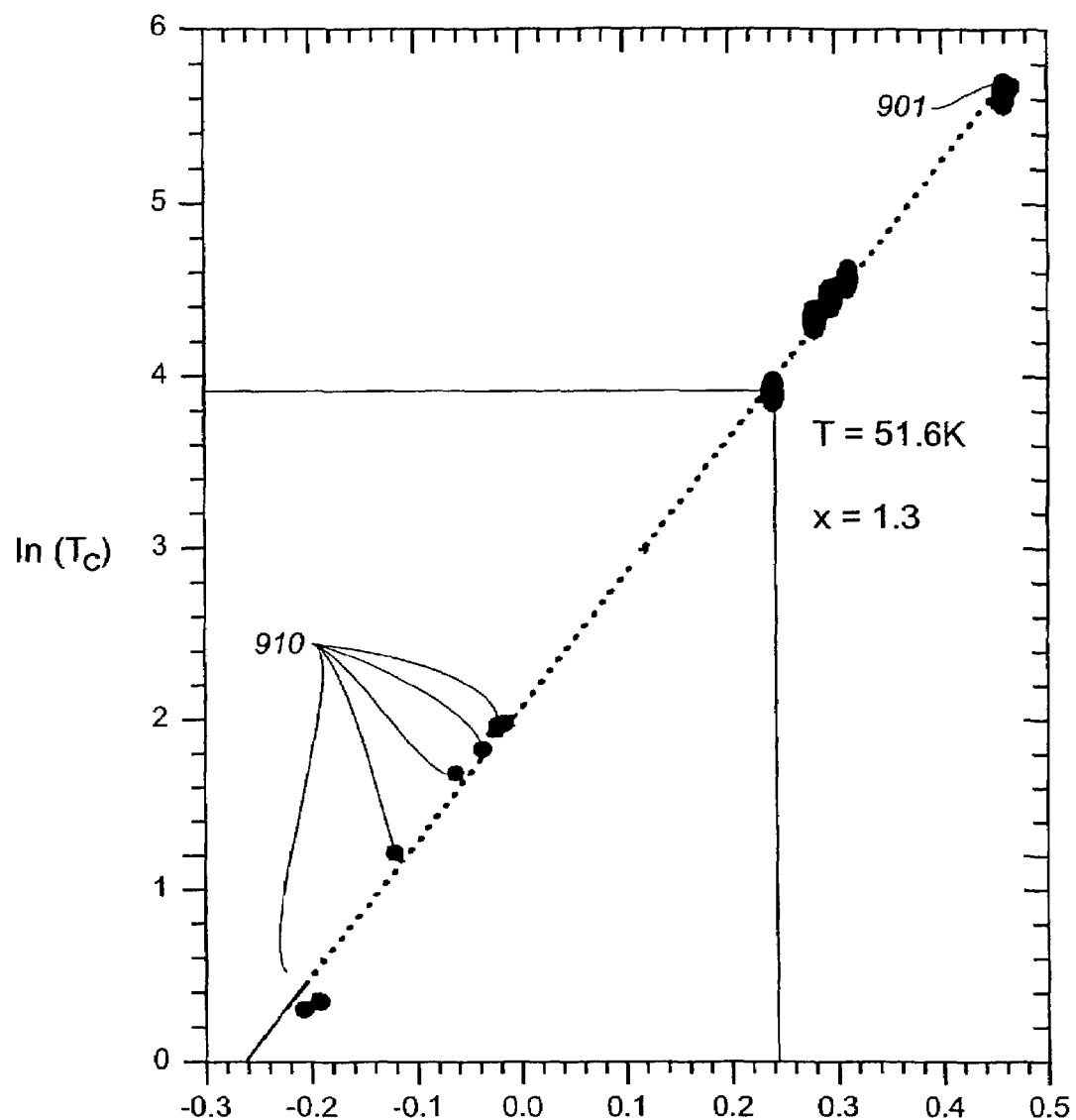
FIG._9

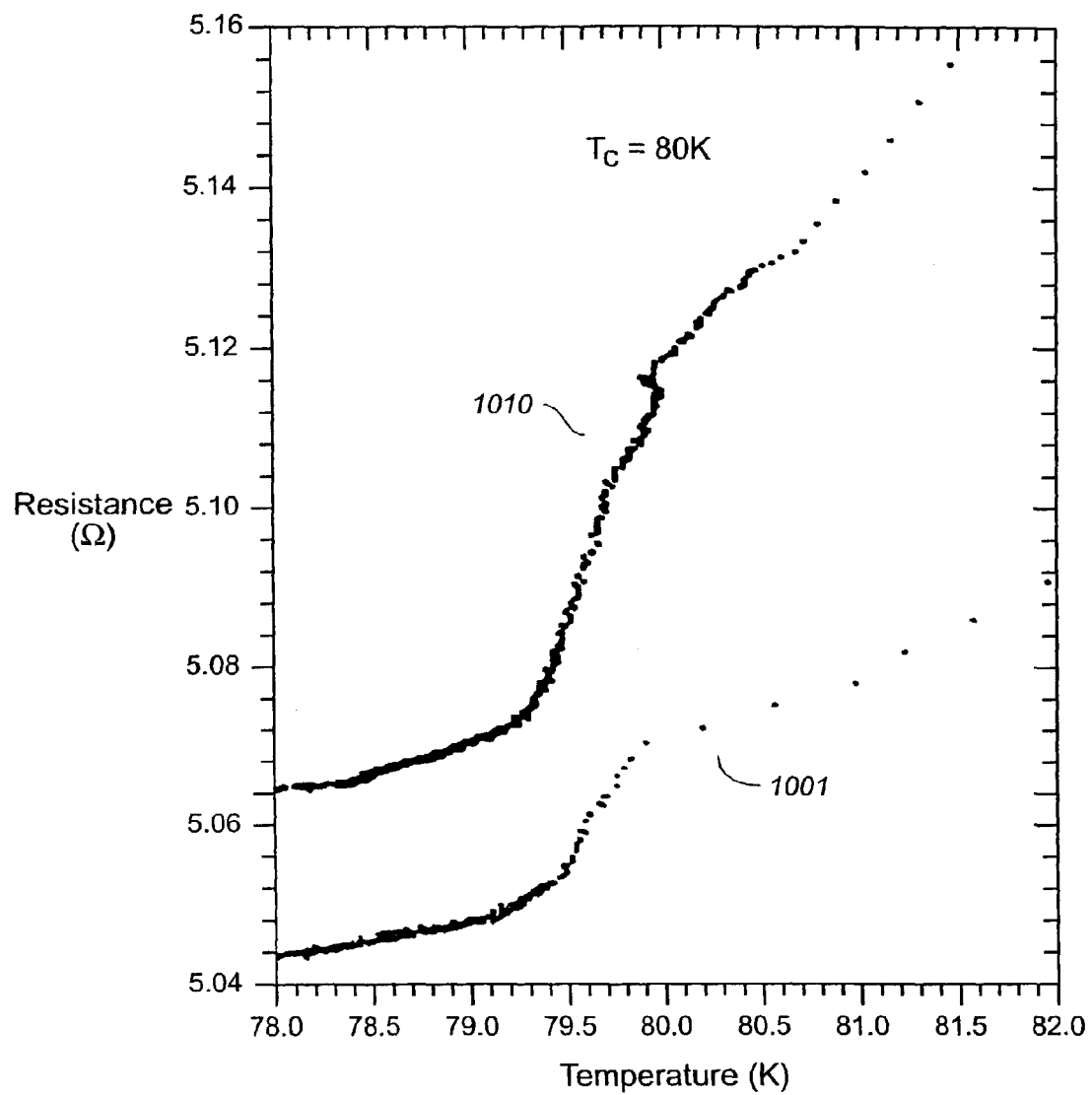
FIG._10A

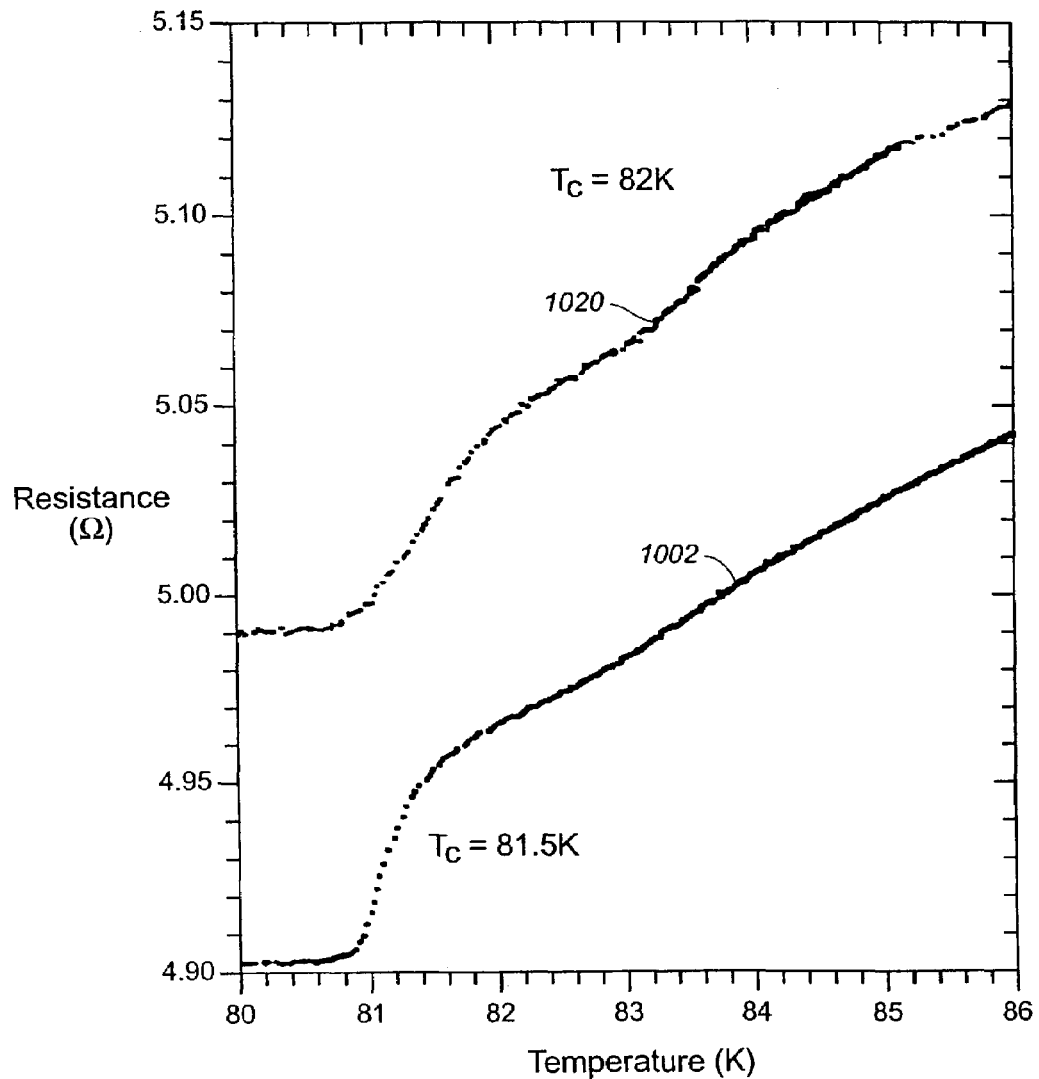
FIG._10B

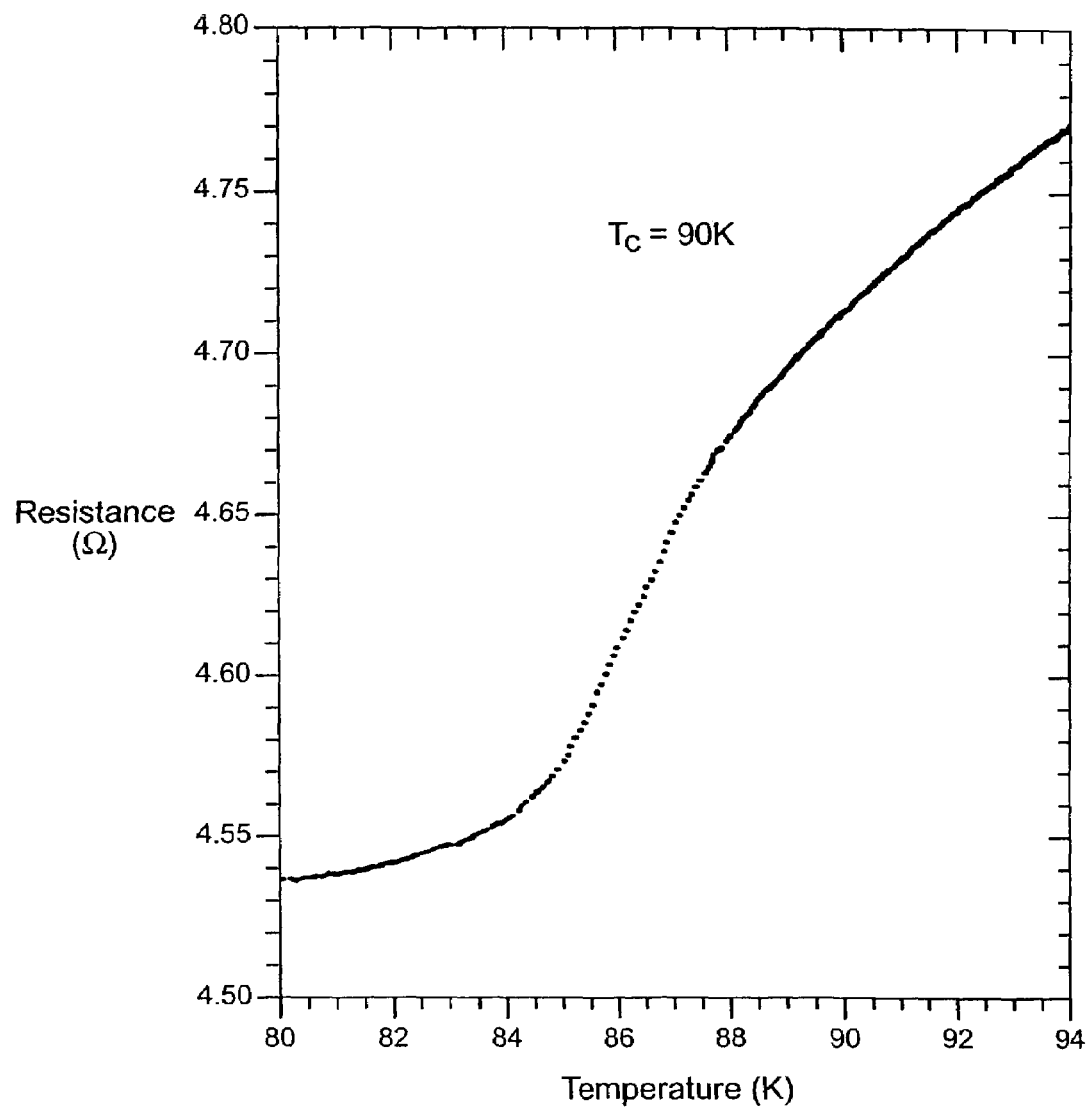
FIG._11A

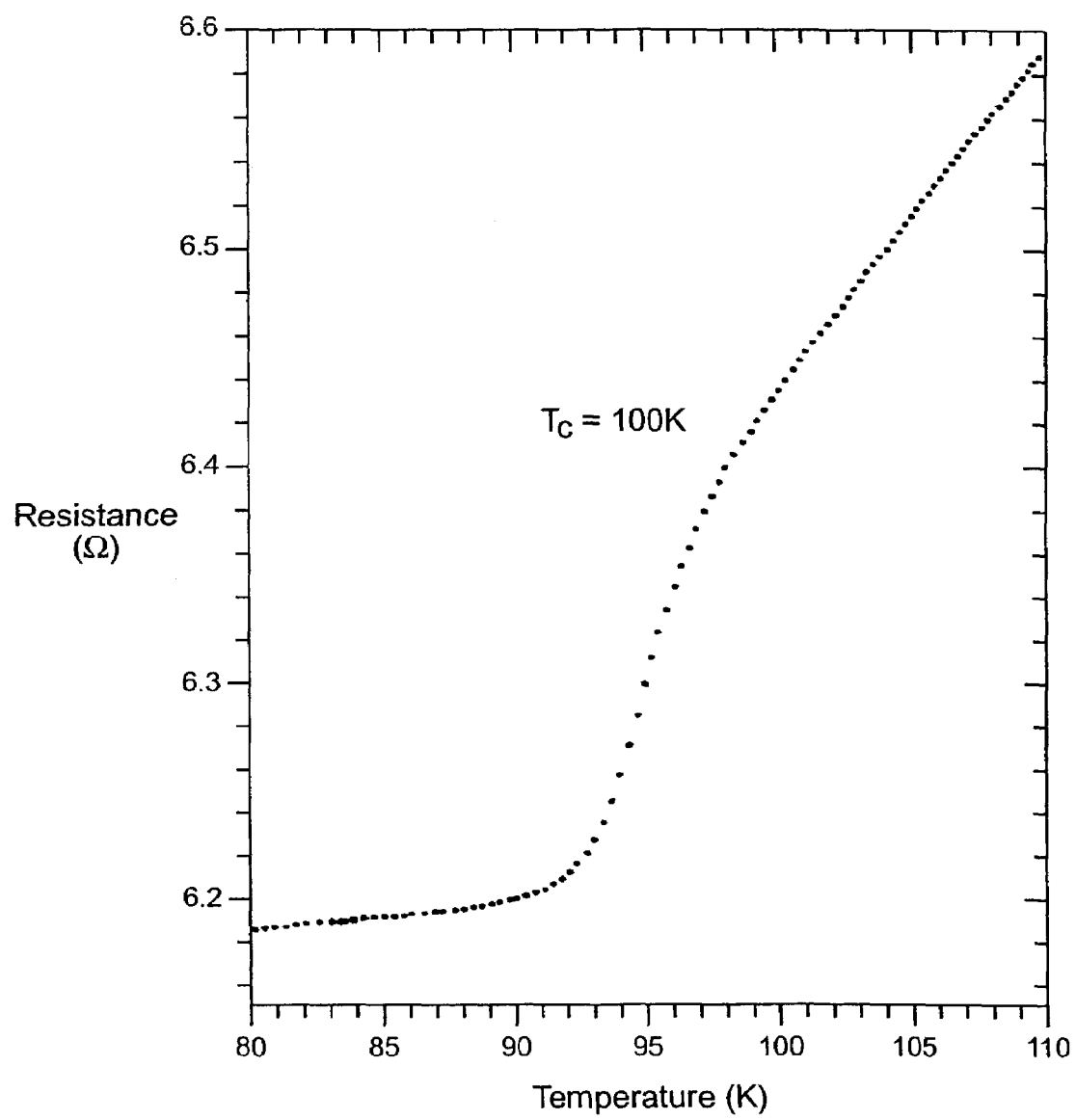
FIG._11B

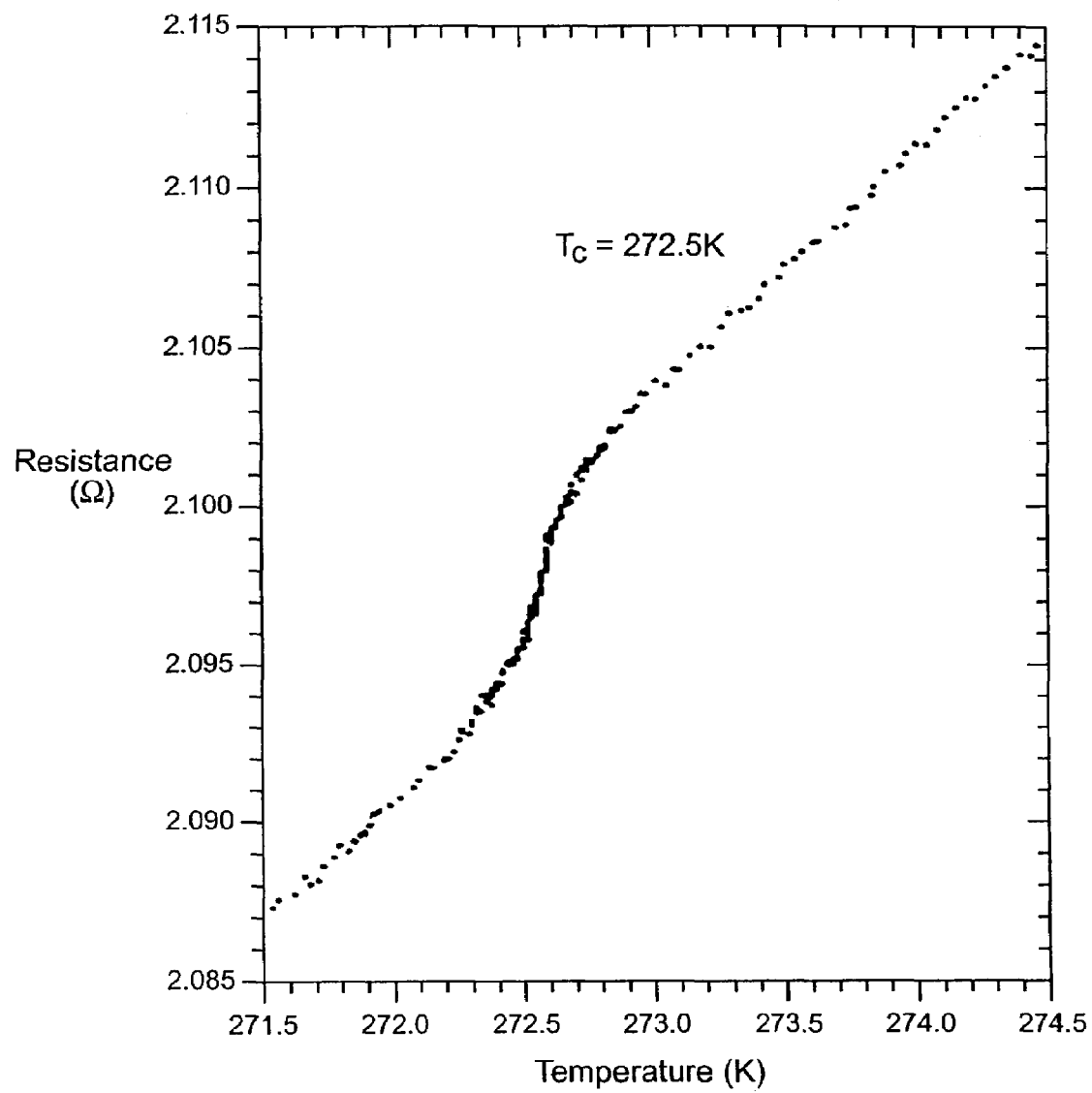
FIG._11C

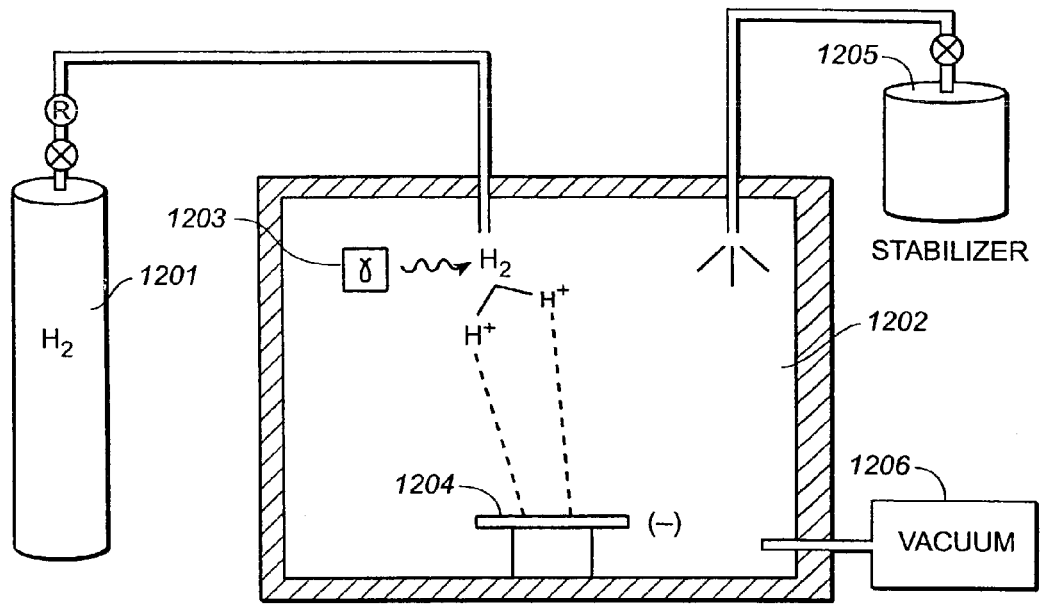
FIG._12
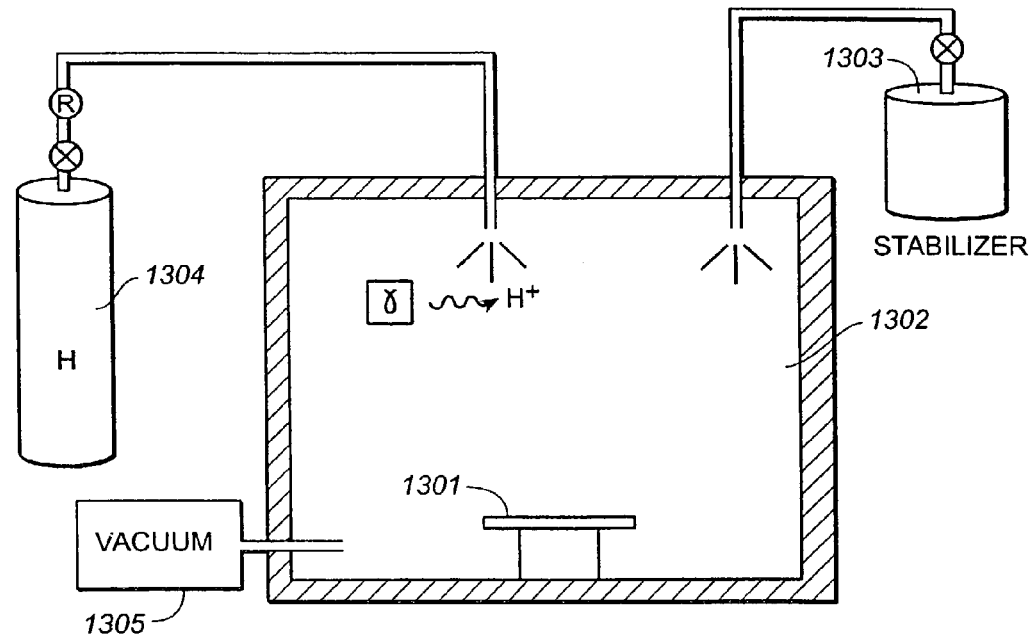
FIG._13

US 7,033,568 B2

HIGH $T_C$ PALLADIUM HYDRIDE SUPERCONDUCTOR

CROSS REFERENCE TO RELATED APPLICATIONS

This application claims the benefit of priority under 35 U.S.C. § 119(e) to U.S. Provisional Application Ser. No. 60/188,585 filed Mar. 10, 2000.

TECHNICAL FIELD

This invention relates to the field of superconductivity, and more particularly to a high $T_c$ palladium hydride superconducting material.

BACKGROUND

Superconductors are materials that can conduct electricity with little or no electrical resistance. Superconducting materials are generally characterized by a critical temperature, $T_c$, below which the materials are in a superconducting phase in which they can conduct an electric current without electrical resistance. Above the critical temperature, superconductors are in a normal conducting phase in which they can conduct an electric current with an electrical resistance and concomitant electrical energy loss.

The superconducting phase transition in crystalline materials results from an attractive interaction potential between pairs of electrons, known as Cooper pairs, within the crystal lattice. While electrons in a crystal lattice ordinarily experience a net repulsion for one another, it is possible for them to experience an overall net attraction for one another as a result of each electron's attractive interaction with the positive ions located at the lattice points in the crystal lattice.

Hydrogen and its isotopes can be dissolved in many metals, and can occupy the interstitial sites in the host metal crystal lattice. When hydrogen and its isotopes are dissolved in palladium (Pd), the resulting chemical compound is known as a palladium hydride, and is represented by the chemical formula $Pd^yH_x$, where $^yH$ is hydrogen ($^1H$), deuterium ($^2H$), or tritium ($^3H$) and x is the stoichiometric ratio of $^yH$ to Pd. As discussed below, in a palladium crystal lattice there are a maximum of 3 interstitial sites per palladium atom that can be occupied in a unit cell of the palladium crystal lattice. Consequently, palladium hydrides $Pd^yH_x$ can be formed having stoichiometric ratios $x \leq 3$.

Palladium naturally occurs in metallic form, and has a crystal lattice that can be classified as a face centered cubic (fcc) Bravais lattice as shown in FIG. 1. A unit cell of an fcc lattice contains 4 atoms, thus a unit cell of a palladium crystal contains 4 Pd atoms. When hydrogen ions dissolve in palladium's fcc lattice, they can occupy one of two types of interstitial sites in a unit cell of the lattice, respectively referred to as octahedral (O) and tetrahedral (T) sites. At low temperatures, dissolved hydrogen ions tend to preferentially occupy the tetrahedral interstitial sites in the palladium lattice, while at higher temperatures dissolved hydrogen ions tend to preferentially occupy the octahedral sites.

The octahedral sites, marked by an (O) in FIG. 1, are located at the center of the fcc unit cell, and along any edge of the unit cell at a point that is equidistant between two lattice vertices. Thus, there are four octahedral interstitial sites per unit cell, or one octahedral site per palladium atom in a palladium crystal lattice. The octahedral sites are so named, because each site has six nearest neighbor palladium atoms that can form the vertices of an octahedron surrounding the site.

The tetrahedral sites, marked by a (T) in FIG. 1, are located in each of the eight corners of the fcc lattice unit cell. One such corner is shown in an exploded view in FIG. 1. Thus, there are eight tetrahedral interstitial sites per unit cell, or two tetrahedral sites per palladium atom in a palladium crystal lattice. The tetrahedral sites are so named, because each site has four nearest neighbor palladium atoms that can form the vertices of a tetrahedron surrounding the site.

Palladium hydrides, $Pd^yH_x$, have been known to undergo superconducting phase transitions and to exhibit the phenomenon of superconductivity since 1972. In particular, $Pd^1H_1$ is known to have a superconducting critical temperature of 9K; while $Pd^2H_1$ is known to have a superconducting critical temperature of 11K; and $Pd^3H_{0.8}$ is known to have a superconducting critical temperature of 4K. While the palladium hydride system $Pd^yH_x$ has thus been known to possess superconducting properties at or near stoichiometric ratios approaching $x \sim 1$, no one has thus far been able to explore whether the system exhibits superconducting properties at large stoichiometric ratios, characterized by $x > 1$.

One reason for this, is that a pure palladium hydride system is unstable for stoichiometric ratios $x > 1$. While it is possible to dissolve hydrogen ions into a palladium crystal lattice at such high concentrations, the hydrogen ions readily diffuse out of the lattice over a short period of time on the order of a few minutes. Thus, to produce a palladium hydride system with stoichiometric ratios $x > 1$, it is necessary to develop a method to stabilize $Pd^yH_x$ compounds for $x > 1$.

SUMMARY

The invention discloses a palladium hydride superconducting material, $Pd^yH_x$ where $^yH_x$ is $^1H_x$, $^2H_x$, or $^3H_x$ and x is the stoichiometric loading ratio of $^yH_x$ to Pd in the material. The superconducting material has critical temperatures $T_c \geq 11K$ for stoichiometric loading ratios $x \geq 1$. The critical temperature linearly depends upon a power of the stoichiometric loading ratio. Samples have been produced having critical temperatures of 51.6K, 80K, 82K, 90K, 100K, and 272.5K.

The surface of the superconducting material is coated with a stabilizing material to stabilize the stoichiometric loading ratio of isotopic hydrogen to palladium in the material. The stabilizing material can be a metal, metal oxide, ceramic, or polymer that can be bonded to, amalgamated to, or alloyed with the palladium hydride superconductor to prevent the isotopic hydrogen loaded into the palladium lattice from degassing or deloading. Examples of stabilizing materials include mercury, aluminum, nickel, copper, gold, silver, platinum, zinc, steel, cadmium, lead, PTFE, nickel oxide, or copper oxide. The stabilizing material allows $Pd^yH_x$ samples to be produced having stoichiometric loading ratios $x \geq 1$ that are stable over periods exceeding 24 hours, over temperature cycles from 4K to 400K, and down to pressures of 1 mbar.

In one embodiment, the palladium hydride superconducting material is made by electrochemically loading isotopic hydrogen into a palladium lattice in an electrochemical cell. In this embodiment, a power supply sends an electric current through an electrochemical cell filled with an acidic solution. The electromotive force created by the power supply causes hydrogen isotopes in the acidic solution to be reduced at a palladium cathode, and to subsequently dissolve into the cathode. The stoichiometric ratio of isotopic hydrogen loaded into the palladium lattice can be monitored in real time by monitoring the resistance of the sample relative to its resistance prior to hydrogen loading. When a desired stoichiometric loading ratio is reached, a stabilizing compound can be bonded to, amalgamated to, or alloyed with the palladium cathode, and the power supply turned off.

The anode in the electrochemical cell can in principle be made from any metal, however certain advantages are achieved when the anode is made from a non-corrosive metal such as platinum, nickel, tungsten, gold, copper, or titanium. The anode and palladium cathode in the electrochemical cell can be of arbitrary shapes and sizes, and placed in the cell in an arbitrary geometry.

The acidic solution used in the electrochemical cell can be any electrolytic solution that can serve as a source of isotopic hydrogen ions. In one embodiment it is made by dissolving an electrolyte in $10^{-5}$ M light or heavy water ($^1H_2O$, $^2H_2O$, $^3H_2O$). However, solutions which are more or less acidic can be made by dissolving an electrolyte in light or heavy water having higher or lower molarities.

The electrolyte dissolved in the electrolytic solution can be any salt that can be made from a cationic species and an anionic species. The cationic species can be chosen from among the elements lithium, sodium, potassium, rubidium, cesium, francium, beryllium, magnesium, calcium, strontium, barium, radium, manganese, iron, cobalt, nickel, copper, zinc, cadmium, tin, scandium, cerium, and lead. The anionic species can be chosen from among the sulfates, phosphates, chlorates, carbonates, borates, bromates, chromates, oxalates, nitrates, perchlorates, iodates, permanganates, acetates, sulfites, nitrites, and chlorites. In one embodiment, the electrolyte dissolved in the acidic solution is a $SrSO_4$ salt.

The stabilizing compound can be any compound that can bond to the surface of the palladium cathode to prevent the isotopic hydrogen loaded into the cathode from degassing or deloading. The stabilizing compound can be the salt of any metal which can be bonded to, amalgamated to, or alloyed with the palladium cathode such as a salt of mercury, aluminum, nickel, copper, gold, silver, platinum, zinc, steel, cadmium, or lead. In addition, the stabilizing compound can be a solution of any insulator that can be bonded to the surface of the palladium cathode such as a polymer, a ceramic, or a metal oxide. For example, the insulator can be PTFE, nickel oxide, or copper oxide. In one embodiment, the stabilizing compound is a $10^{-5}$ M mercurous sulfate solution. The mercury in the solution is electrochemically amalgamated to the surface of the palladium hydroxide.

The power supply can be a direct current or alternating current power supply, and can supply current to the electrochemical cell at a current density or root-mean-square current density between 1 and 1000 mA per $cm^{-2}$. The power supply can also be a pulsed current power supply and supply current pulses to the electrochemical cell at repetition rates of up to 25 kHz. The current pulses can have rise times on the order of 50–500 nsec, widths on the order of 0.5 to 5.0 msec, and peak currents of up to 6000 A.

In another embodiment of the invention, uniform thin film palladium hydride superconductors can be made by allowing gas phase hydrogen isotopes to diffuse into a thin film palladium sample. In this embodiment, a thin film sample is placed inside a pressure chamber that is pressurized with a source of gas phase hydrogen isotopes to pressures up to 100 bar. Over time, the hydrogen isotopes dissolve into the thin film palladium sample. The stoichiometric loading ratio of the thin film sample can be measured in real time by measuring the relative resistance of the sample. When the relative resistance indicates a desired stoichiometric loading ratio, a stabilizing material can be deposited onto the surface of the sample using well known thin film deposition techniques such as chemical vapor deposition or molecular beam epitaxy.

In still another embodiment of the invention, uniform thin film palladium hydride superconductors can be made by injecting gas phase hydrogen isotopes onto a thin film palladium sample. In this embodiment a source of isotopic hydrogen in the gas phase is delivered to a vacuum chamber. The hydrogen isotopes are ionized by an ionizing source such as an x-ray source. The resulting hydrogen isotope cations are then accelerated toward a thin film palladium cathode where they are absorbed. The stoichiometric loading ratio of the thin film sample can be measured in real time by measuring the relative resistance of the sample. When the relative resistance indicates a desired stoichiometric loading ratio, a stabilizing material can be deposited onto the surface of the sample using well known thin film deposition techniques such as chemical vapor deposition or molecular beam epitaxy.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is a schematic illustration of a unit cell in a palladium crystal lattice.

FIG. 2 is a schematic illustration of an apparatus that can be used to load a palladium lattice with hydrogen or its isotopes at stoichiometric ratios exceeding $x=1$.

FIG. 3 is a prior art plot of the measured relative resistance of $Pd^yH_x$ for $^1H$ and $^2H$ and stoichiometric ratios $x \leq 1$.

FIG. 4 is a plot of the relative resistance of $Pd^yH_x$ for $^1H$ and $^2H$ and stoichiometric ratios $x \leq 2$, based on a phenomenological model of resistance in the $Pd^yH_x$ system.

FIG. 5 is a plot of the relative resistance of $Pd^1H_x$ as a function of time for a $^1H$ to Pd stoichiometric ratio of $x=0.98$.

FIG. 6 is a plot of the resistance of a $Pd^1H_x$ sample as a function of temperature, showing a superconducting phase transition at a temperature of 51.6K.

FIG. 7 is a schematic illustration of an $^yH_x$ loaded palladium wire having a plurality of domains, each of which has a different stoichiometric loading ratio x.

FIG. 8 is a plot of the temperature dependence of a critical magnetic field that destroys superconductivity in a sample via the Meisner effect.

FIG. 9 is a log-log plot of the critical temperature versus stoichiometric loading ratio of a palladium sample loaded with $^yH$ at a stoichiometric loading ratio x.

FIGS. 10A and 10B are plots of the resistance of a $Pd^1H_x$ sample as a function of temperature, showing superconducting phase transitions at temperatures of around 80K that are persistent over a period of at least 24 hours.

FIGS. 11A, 11B, and 11C are plots of the resistance of a $Pd^1H_x$ sample as a function of temperature, showing superconducting phase transitions at temperatures of 90K, 100K, and 272.5K, respectively.

FIG. 12 is a schematic illustration of a pressure chamber apparatus that can be used to load a thin film palladium lattice with gas phase hydrogen isotopes at stoichiometric ratios exceeding $x=1$.

FIG. 13 is a schematic illustration of a vacuum chamber apparatus that can be used to load a thin film palladium lattice with gas phase hydrogen isotopes at stoichiometric ratios exceeding x=1.

Like reference symbols in the various drawings indicate like elements.

DETAILED DESCRIPTION

As previously mentioned, palladium hydride systems $Pd_yH_x$ for average stoichiometric ratios $x \leq 1$ are known in the art. However, the palladium hydride system becomes intrinsically unstable for stoichiometric ratios approaching an average stoichiometric ratio $x \sim 1$. As a result, little is known about the properties of such systems for average stoichiometric ratios $x \geq 1$.

FIG. 2 is a schematic illustration of an apparatus (200) capable of producing a stable palladium hydride system at average stoichiometric ratios $x \geq 1$. Apparatus 200 consists of a power supply (205), an electrochemical cell (201) having an anode (202), a palladium cathode (203), and an acidic solution (204), and means (208, 209) for adding an electrolyte to acidic solution (204). Power supply (205) serves as a source of electric current, and can either be a direct-current (DC) power supply or an alternating-current (AC) power supply. In one embodiment, power supply (205) is a DC power supply and supplies an electrochemical current density of between 1 and 1000 mA per $cm^{-2}$ between anode (202) and palladium cathode (203). In another embodiment, power supply (205) is an AC power supply and supplies a root-mean-squared electrochemical current density of between 1 and 1000 mA per $cm^{-2}$ between anode (202) and palladium cathode (203).

Acidic solution (204) serves as a source of $^3H^+$ ions in electrochemical cell (201), and conducts the current generated by power supply (205) through the cell. In one embodiment, acidic solution (204) is made by dissolving an electrolyte in $10^{-5}$ M light water or $^1H_2O$. The $10^{-5}$ M $^1H_2O$ acts as a source of $^1H^+$ ions and yields an acidic so having a pH~5.0. Other acidic solutions (204) having higher or lower pH's can be used in electrochemical cell (201), and can be produced by dissolving an electrolyte into light water having respectively lower or higher molarities such as $10^{-6}$ or $10^{-4}$ M water. Heavy water, $^2H_2O$ or $^3H_2O$, can be used instead of $^1H_2O$ to act as a source of $^2H^+$ or $^3H^+$ ions, respectively.

In one embodiment, the electrolyte dissolved in acidic solution (204) is a $SrSO_4$ salt. Other electrolytes can be used however, and still be within the scope of the invention. For example, and by way of example only, the electrolyte can be any salt that can be made from a cationic species and an anionic species, where the cationic species is chosen from among the elements lithium, sodium, potassium, rubidium, cesium, francium, beryllium, magnesium, calcium, strontium, barium, radium, manganese, iron, cobalt, nickel, copper, zinc, cadmium, tin, scandium, cerium, and lead; and where the anionic species is chosen from among the sulfates, phosphates, chlorates, carbonates, borates, bromates, chromates, oxalates, nitrates, perchlorates, iodates, permanganates, acetates, sulfites, nitrites, and chlorites.

The anode (202) in electrochemical cell (201) can in principle be made from any metal, however certain advantages are achieved when anode (202) is made from a non-corrosive metal. Thus, in one embodiment, anode (202) is made from platinum wire, however, in alternative embodiments anode (202) can be made from alternative non-corrosive metals such as nickel, tungsten, gold, copper, or titanium. Anode (202) and palladium cathode (203) can be of arbitrary shapes and sizes, and placed in electrochemical cell in an arbitrary geometry. However, in one embodiment, anode (202) is made from a 30 cm long, 1 mm diameter platinum wire, while palladium cathode (203) is made from a 30 cm long, 50 μm diameter palladium wire, and anode (202) and cathode (203) are oriented parallel to one another and separated from one another by 7 cm in electrochemical cell (201). Of course, other geometries for the position, size, and configuration of anode (202) and palladium cathode (203) are possible and within the scope of the invention.

When power supply (205) is turned on a positive electromotive force develops in acidic solution (204) between anode (202) and palladium cathode (203). As a result of this force, an electric current flows through electrochemical cell (201) and $^3H^+$ ions are attracted to palladium cathode (203). At cathode (203) the $^3H^+$ ions are reduced by the free electrons in palladium cathode (203) to form neutral $^3H$ atoms. The $^3H$ atoms then dissolve in palladium cathode (203) where they occupy either octahedral or tetrahedral interstitial sites in the palladium lattice. This process of depositing $^3H$ atoms into a palladium lattice, whether performed by electrochemical or other means, is referred to as hydrogen loading.

To measure the stoichiometric ratio of $^3H$ atoms dissolved into palladium cathode (203) during the hydrogen loading process, a relative resistance measurement across palladium cathode (203) can be made. The relative resistance measurement is a ratio of the resistance of palladium cathode (203) after a given amount of $^3H$ has been loaded into it to the resistance of palladium cathode (203) before any $^3H$ has been loaded into it. The relative resistance of a $Pd^3H_x$ system is known to be a function of the average stoichiometric ratio x of $^3H$ to Pd in the system, and is shown in FIG. 3 for stoichiometric ratios $x \leq 1$. The relative resistance of the palladium cathode (203) can thus be used to determine the average stoichiometric ratio of $^3H$ to palladium in palladium cathode (203) while it is being loaded with $^3H$ in electrochemical cell (201).

It should be noted that the relative resistance measurement technique can only measure the average stoichiometric loading ratio x in palladium cathode (203) because the dissolution of $^3H$ in palladium cathode (203) does not uniformly occur throughout the cathode. In particular, since dissolution of $^3H$ in palladium cathode (203) primarily occurs along the outer surface of the cathode, the distribution of $^3H$ throughout palladium cathode (203) is expected to have a radial dependence and to be much larger along the outer layer of cathode (203) than along its core. However, neither the homogeneity nor the gradient of the loaded $^3H$ atoms inside palladium cathode (203) can be known from the average measured stoichiometric loading ratio x.

The resistance across palladium cathode (203) can be measured in any number of ways known in the art. In one embodiment, shown in FIG. 2, the resistance is measured by generating an AC signal with an AC signal generator (206), passing the generated signal through palladium cathode (203), and measuring the voltage drop in the signal across the cathode. Prior to measuring the voltage drop across cathode (203), the DC bias added to the generated AC signal by the current produced in electrochemical cell (201) is filtered out through high-pass filters (207). Using this technique, the relative resistance of palladium cathode (203) can be determined from measurements of its resistance before power supply (205) is turned on and at some subsequent time during the loading process after an amount of $^3H$ has been loaded onto palladium cathode (203) to achieve a stoichiometric loading ratio x.

Referring again to FIG. 3, the relative resistances of $^yH$ loaded Pd lattice systems at room temperature are known for systems having average stoichiometric loading ratios $x \leq 1$. However, no relative resistances are known for $Pd^yH_x$ systems having average stoichiometric loading ratios of $x > 1$ because of the inherent instability of such systems which rapidly and spontaneously undergo $^yH$ deloading. Consequently, to measure the stoichiometric loading ratio for $Pd^yH_x$ systems having an average stoichiometric loading ratio $x > 1$ using a relative resistance measurement technique, a model for the relative resistance as a function of stoichiometric loading ratio must be developed so that the relative resistance measurements for $x \leq 1$ can be extrapolated to the region $1 \leq x \leq 3$.

As shown in FIG. 4, a phenomenological model has been developed. The model predicts the relative resistance of $Pd^yH_x$ systems at room temperature will exponentially decrease with increasing stoichiometric loading ratio for average stoichiometric loading ratios $x > 1$. Moreover, the model predicts the relative resistance will decrease to essentially 0 resistance at an average stoichiometric loading ratio of $x \geq 1.6$, such that the $Pd^yH_x$ system will be in a room temperature superconducting state at such loading ratios.

The details of the phenomenological model are as follows. The palladium hydride system $Pd^yH_x$ is modeled as having two electron transport mechanisms available in parallel, one superconducting and the other normal or non-superconducting. Each electron transport mechanism is modeled to provide a unique conductive pathway for electrons in the $Pd^yH_x$ system, such that each unique conductive pathway has a corresponding resistance that uniquely varies with the stoichiometric loading ratio x of the system. Because the two conductive pathways are modeled to be present in parallel, their corresponding resistances are added in parallel to obtain the overall resistance of the $Pd^yH_x$ system.

The normal or non-superconductive electron transport mechanism is modeled to provide a conductive pathway having a relative resistance that linearly depends upon the stoichiometric loading ratio. This linear dependence is believed to result from the linear increase in the number of scattering centers in the system with the increase in the stoichiometric ratio. Thus, the relative resistance of the normal electron transport mechanism is modeled as:

$$R/R_0 = 1 + \lambda x \quad \text{(Eq. 1)}$$

where R is the resistance at stoichiometric loading ratio x, $R_0$ is the resistance of a pure palladium system at stoichiometric loading ratio 0, $\lambda$ is a linear constant of proportionality, and x is the stoichiometric loading ratio.

The superconductive electron transport mechanism is modeled to provide a conductive pathway having a resistance that exponentially depends upon the stoichiometric loading ratio x. This exponential dependence is believed to result from fluctuations of the $Pd^yH_x$ system from the superconducting state. Thus, the resistance of the superconducting transport mechanism is modeled as:

$$R/R_0 = \beta e^{-\gamma(x-x_c)/k_B T} \quad \text{(Eq. 2)}$$

where R and $R_0$ are as defined in Eq. 1, $\beta$ is a constant of proportionality, $\gamma(x-x_c)$ is the condensation energy of a superconducting state as a function of the stoichiometric loading ratio x and a critical stoichiometric ratio $x_c$ at which the $Pd^yH_x$ system condenses into the superconducting state, $k_B$ is Boltzmann's constant, and T is the absolute temperature in degrees Kelvin.

Adding the relative resistances from Eq. 1 and Eq. 2 in parallel, one obtains a phenomenological expression for the relative resistance of the $Pd^yH_x$ at room temperature as a function of the stoichiometric loading ratio of $^yH$ to Pd in the system. The expression can be written as:

$$R/R_0 = \frac{(1+\lambda x)\beta e^{-\gamma(x-x_c)/k_B T}}{1 + \lambda x + \beta e^{-\gamma(x-x_c)/k_B T}} \quad \text{(Eq. 3)}$$

where R, $R_0$, $\lambda$, $\beta$, $\gamma$, x, $x_c$, $k_B$ and T are as defined in Eq. 1 and Eq. 2. The expression in Eq. 3 was fit to experimental data for the relative resistance $R/R_0$ at stoichiometric loading ratios $x \leq 1$ to determine the free parameters $\lambda$, $\beta$, $\gamma$ and $x_c$.

Using the fitted free parameters, the resulting curve of the relative resistance of a $Pd^yH_x$ system as a function of stoichiometric loading ratio up to a maximum loading ratio of $x = 2$ is shown in FIG. 4 for a temperature T of 300K, and for $^1H$ (401) and $^2H$ (402). As can be seen from FIG. 4, at 300K the $Pd^yH_x$ system is predicted to be a superconductor at stoichiometric loading ratios greater than a critical stoichiometric loading ratio $x_c \geq 1.6$. At different temperatures, the phenomenological relative resistance curves plotted in FIG. 4 are compressed so that the critical stoichiometric loading ratio decreases with decreasing temperature. For example, FIG. 4 also shows the relative resistance of a $Pd^yH_x$ system as a function of stoichiometric loading ratio for $^1H$ (410) and $^2H$ (420) at a temperature of 66K. In these curves, the system is seen to be a superconductor at critical stoichiometric loading ratio $x_c \geq 1.2$ Referring back to FIG. 2, $^yH$ loading of palladium cathode (203) by electrochemical cell (201) can be performed until the relative resistance measurement of the cathode (203), as measured by the AC signal produced by AC signal generator (206), indicates from the plot of FIG. 4 that the palladium cathode (203) has been loaded with sufficient $^yH$ to yield an average $^yH$ to Pd stoichiometric ratio of $x \geq 1$. Thus the $^yH$ loading of palladium cathode (203) can be performed until the relative resistance of the cathode rises to its maximum of ~1.8, then descends to negative relative resistance values indicating an average stoichiometric loading ratio of $x \geq 1$ as shown in FIG. 4.

When the relative AC resistance measurements of palladium cathode (203) indicates that it has been loaded with $^yH$ at an average stoichiometric ratio exceeding $x \geq 1$, a stabilizing compound (210) is added to the electrochemical cell (201) using addition means (208) and (209). The addition means (208) and (209) can be any means for adding stabilizing compound (210) to electrochemical cell (201). For example, the addition means can be a sample holder (208) and a valve (209) that is opened to allow stabilizing compound (210) to gravitationally fall into the electrochemical cell (201).

Stabilizing compound (210) can be any compound that can bond to the surface of the $^yH$ loaded palladium cathode (203) to thereby prevent the $^yH$ loaded into the cathode from degassing or deloading. In one embodiment, stabilizing compound (210) is a $10^{-5}$ M mercurous sulfate ($Hg_2SO_4$) solution. Other stabilizing compounds (210) can be used however, provided they can prevent the loaded $^yH$ from degassing. For example, stabilizing compound (210) can be the salt of any metal which can be bonded to, amalgamated to, or alloyed with palladium cathode (203). Thus, for example, stabilizing compound (210) can be any salt of mercury, aluminum, nickel, copper, gold, silver, platinum, zinc, steel, cadmium, or lead. In addition, stabilizing compound (210) can be a solution of any insulator that can be bonded to the surface of palladium cathode (203) such as a polymer, a ceramic, or a metal oxide. For example, the insulator can be PTFE, nickel oxide, or copper oxide. Other insulating materials can be used as well, provided they can prevent the loaded $^3$H from degassing out of palladium cathode (203). Once stabilizing compound (210) has been bonded or electroplated onto the surface of palladium cathode (203) the DC power supply (205) is turned off.

Stabilizing compound (210) prevents spontaneous degassing or deloading of $^3$H from the Pd$^3$H$_x$ at stoichiometric ratios exceeding $x \geq 1$. The stability of $^3$H loaded Pd$^3$H$_x$ samples produced by apparatus (200) for stoichiometric loading ratios approaching $x \sim 1$ can be seen in FIG. 5. As shown in FIG. 5, the relative resistance of a palladium cathode (203) loaded with $^3$H is seen to dramatically increase in a region (501) to a maximum of 1.8 while the current source (205) is supplying an electromotive force to the electrochemical cell (201). The relative resistance then suddenly decrease in a region (502) when a mercurous sulfate stabilizing compound (210) is added to the cell. The Hg from the mercurous sulfate is allowed to amalgamate the palladium cathode (203), thereby preventing spontaneous deloading of $^3$H until a region (503) of stable relative resistance less than 1.2 is reached, at which time the current source (205) is turned off.

As shown in FIG. 4, the stable relative resistance of 1.2 at region (503) can result from either a $^3$H to Pd stoichiometric ratio of 0.2 or 0.98. The stoichiometric ratio is known to be 0.98 because of the regions of dramatic rise (504) and subsequent decay (505) of the relative resistance that occur when the palladium cathode (203) finally deloads. The region of dramatic rise (504) corresponds to the stoichiometric ratio region between $0.7 \leq x \leq 0.98$ during which the relative resistance increases with decreasing stoichiometric ratio. The region of subsequent decay (505) corresponds to the stoichiometric ratio region between $0.0 \leq x \leq 0.7$ during which the relative resistance decreases with decreasing stoichiometric ratio and returns to unity at a stoichiometric ratio of $x=0$. Referring again to FIG. 5, the region (503) of stable relative resistance 1.2 of the $^3$H loaded palladium cathode (203) at a stoichiometric ratio of $x=0.98$ is seen to last for a period of approximately 12000 seconds or 3.3 hours before deloading occurs.

Once the samples (203) of Pd$^3$H$_x$ for stoichiometric ratios $x \geq 1$ were prepared in apparatus (200) as described, they were laid on a copper sample holder to ensure temperature uniformity, quenched to liquid helium or liquid nitrogen temperatures, and then slowly allowed to warm to room temperature. While the samples (203) were slowly warming, four point AC electrical resistance measurements of the samples were taken at 8 second intervals both in the presence and absence of constant magnetic fields. The four point AC electrical resistance measurement technique is well known in the art, and is used to measure the electrical resistance of a sample without measuring the resistance of the electrical contacts on the sample or of the lead wires from the sample to the resistance measuring equipment Once the samples warmed to room temperature, they were re-quenched to liquid helium or liquid nitrogen temperatures, and there electrical resistances were measured a second time as they warmed to room temperature. Thus, the characteristics of the electrical resistances of the samples were tested over cyclical temperature variations ranging from 4K to 300K, and were found to be independent of such temperature cycles. Finally, the electrical resistance measurements were repeated on the samples after a period of 24 hours had elapsed, and some of the samples were found to be stable for more than 24 hours.

One sample (203) of Pd$^3$H$_x$ prepared in apparatus (200) was observed to have the electrical resistance shown in FIG. 6. Two plots of electrical resistance versus temperature are shown in FIG. 6, namely plot 601 which was made in the absence of an external magnetic field, and plot 602 which was made in the presence of a constant 1 Tesla magnetic field. These two plots show two interesting properties that suggest that the $^3$H loaded palladium sample (203) is a superconductor with a critical temperature of 51.6K.

The first interesting property seen in FIG. 6, is that the Pd$^3$H$_x$ sample (203) has an electrical resistance in plot 601 that linearly depends on temperature above 56K, exponentially depends on temperature in a region between 40K and 53K, and again linearly depends on temperature below 40K. This pattern of temperature dependence is indicative of the temperature dependence of a multi-domain superconductor having at least one domain with a critical temperature of 51.6K. Here, and throughout this application, the critical temperature is taken to be the temperature at which the electrical resistance exponentially drops to 90% of its initial value in the region where it has an exponential dependence on temperature.

The electrical resistance of the Pd$^3$H$_x$ sample (203) in plot 601 does not drop identically to 0 Ω below critical temperature $T_c$, because sample (203) is a multi-domain sample in which different domains have different stoichiometric loading ratios corresponding to different critical temperatures. As previously mentioned, sample (203) is known to have an average stoichiometric loading ratio of $x \geq 1$ from the relative resistance measurements made during its preparation, however, the distribution of $^3$H within sample (203) is known to be non-homogeneous. As a result, sample (203) is expected to have different domains having different stoichiometric loading ratios x.

Referring again to FIG. 4, for a given critical temperature $T_c$, a sample domain will have a superconducting phase transition at that temperature if it has a stoichiometric loading ratio x that is greater than some critical stoichiometric loading ratio $x_c$. Thus, sample (203) may have some domains having a stoichiometric loading ratio $x > x_c$ that will already be in a superconducting state at $T_c$, other domains having a stoichiometric loading ratio $x = x_c$ that will have a superconducting phase transition at $T_c$, and still other domains having a stoichiometric loading ratio $x < x_c$ that will not exhibit a superconducting phase transition at $T_c$. Thus, the resistance of sample (203) immediately above $T_c$ will have contributions from the resistivities of the domains in the sample that have stoichiometric loading ratios $x \leq x_c$, while the resistance of the sample below $T_c$ will only have contributions from the resistivities of those domains having stoichiometric loading ratios of $x < x_c$. As long as the sample has one or more domains with stoichiometric loading ratios of $x < x_c$, its resistance below $T_c$ will not go identically to zero.

This can perhaps be better explained in reference to FIG. 7, which shows a Pd$^3$H$_x$ sample (203) having a plurality of regions or domains (701–706) having different stoichiometric loading ratios x. Each stoichiometric ratio x corresponds to a critical stoichiometric ratio for a corresponding critical temperature $T_c$. The domains (701–706) can vary arbitrarily in length, size, and geometry due to the non-homogeneity of the $^3$H loading process. A given domain within the sample, such as domain (706), will have a given stoichiometric loading ratio $x_6$. That stoichiometric loading ratio is the critical stoichiometric loading ratio $X_{c6}$ for the onset of superconductivity at some critical temperature $T_{c6}$. If the remaining domains (701–705) have stoichiometric loading ratios $x_i < x_6$ where $i=1, 5$, then all domains (701–706) will contribute to the resistance of sample (203) at temperatures above $T_{c6}$, while only domains (701–705) will contribute to the resistance of sample (203) at temperatures below $T_{c6}$. Thus, even after the superconducting phase transition of domain (706) at temperature $T_{c6}$, sample (203) will exhibit a finite resistance since domains (701–705) remain in a normal conducting state.

The length of domain (706) having a superconducting phase transition at critical temperature $T_{c6}$ can be determined from the jump in electrical resistance in the sample near the critical temperature. At temperatures above $T_{c6}$, all domains (701–706) will contribute to the resistance of sample (203), which can be written as:

$$R_{high} = \rho \cdot \frac{L}{A}; \qquad (T > T_{c6}) \qquad \text{(Eq. 4)}$$

where $R_{high}$ is the resistance, $\rho$ is the resistivity, L is the contributing length, and A is the cross-sectional area of the sample at temperatures $T > T_{c6}$. At temperatures below $T_{c6}$, only domains (701–705) contribute to the resistance of sample (203) since domain (706) is in a superconducting state. Consequently, the resistance of sample (203) can be written as:

$$R_{high} - \Delta R = \rho \cdot \frac{L - l}{A}; \qquad (T < T_{c6}) \qquad \text{(Eq. 5)}$$

where $R_{high}$, $\rho$, L, and A are defined as in Eq. 4, $\Delta R$ is the drop in sample resistance around critical temperature $T_{c6}$, and l is the length of the domain (706) that has undergone a superconducting phase transition at critical temperature $T_{c6}$. Subtracting Eq. 5 from Eq. 4, an expression can be developed for the length l of superconducting domain (706), namely:

$$l = \Delta R \cdot \frac{A}{\rho}. \qquad \text{(Eq. 6)}$$

Using this relationship, the length of the domain of the $Pd^yH_x$ sample (203) undergoing a superconducting phase transition at a critical temperature of 51.6K as shown in FIG. 6 is estimated to be around 1 mm.

Referring again to FIG. 6, the second interesting property seen in the figure is that the phase transition in the electrical resistance seen in plot 601 at 51.6K disappears when a 1T external magnetic field is applied as seen in plot 602. This suggests that the superconducting phase in the domain having a superconducting phase transition at 51.6K has been destroyed by the applied magnetic field according to the well known Meisner effect. In the Meisner effect, the critical temperature of a superconducting phase transition is a function of an externally applied magnetic field, H. As shown in FIG. 8, the critical temperature of a superconducting phase is a maximum in the absence of an external magnetic field, and decreases with increasing magnetic field up to a critical field $H_c(0)$ at which the critical temperature reaches 0K, and the superconducting phase is completely destroyed.

Thus, the sample domain in plot 601 of FIG. 6 having a critical temperature $T_{c3}(0)=51.6K$ could be associated with a superconducting phase having a critical field $H_{c3}(0)<1T$ as shown in FIG. 8. Consequently, the superconducting phase in that domain is destroyed when the 1T magnetic field is applied to the sample as shown in plot 602. The domain having a critical temperature $T_{c1}(1)=31.3K$ in plot 602 of FIG. 6, could be associated with a superconducting phase having a critical temperature $T_{c1}(0)>55K$, and a critical field $H_{c3}(0)>1T$ as shown in FIG. 8. Consequently, the superconducting phase of the domain is not destroyed when the 1T magnetic field is applied to the sample, although the critical temperature is lowered to a value $T_{c1}(1)=31.3K$ as shown in plot 602. Similarly, the domain having a critical temperature $T_{c2}(1)=18.8K$ in plot 602, could also be associated with a superconducting phase having a critical temperature $T_{c2}(0) >55K$, and a critical field $H_{c2}(0)>1T$, so that the superconducting phase of the domain is not destroyed when the 1T magnetic field is applied to the sample, although the critical temperature is lowered to a value $T_{c2}(1)=18.8K$ as shown in plot 602.

In the discussion of FIGS. 6 and 7, the phase transition in the electrical resistance of sample (203) at 51.6K can be explained as a superconducting phase transition of a multi-domain sample having at least one domain with a critical temperature of 51.6K. As previously mentioned, while sample (203) is known to have an average stoichiometric loading ratio $x_{avg}$ based on the relative resistance measurements made in apparatus (200), the actual stoichiometric loading ratios $x_i$ of the various domains within the sample are not known. Thus, the actual stoichiometric loading ratio x of the domain in sample (203) that is undergoing a superconducting phase transition at 51.6K is not known.

To determine this loading ratio, prior art data showing the dependence of the critical temperature on the stoichiometric loading ratio for loading ratios $x \leq 1$ have been extrapolated using the phenomenological resistance model shown in FIG. 4. In particular, the phenomenological resistance model shown in FIG. 4 predicts that a $^yH$ loaded palladium sample will have a superconducting phase transition at a temperature of 300K if the sample is loaded with a stoichiometric ratio x that exceeds a critical stoichiometric loading ratio $x_c=1.6$. As shown in FIG. 9, this data point has been plotted as a point (901) on a log-log plot of critical temperature $T_c$ versus critical stoichiometric loading ratio $x_c$. In addition to data point (901), data are plotted in FIG. 9 from prior art data points (910) of critical temperature versus stoichiometric loading ratio. As can be seen from FIG. 9, the plotted data points can be well fit with a linear relationship. This relationship can then be used to determine the stoichiometric loading ratio of the domain in sample (203) having the superconducting phase transition at 51.6K. From FIG. 9, the domain is seen to have a stoichiometric loading ratio of x~1.29.

In FIG. 6, the electrical resistance of a $Pd^yH_x$ sample made in apparatus (200) and having at least one superconducting domain with a critical temperature of 51.6K was disclosed. Other samples were made in apparatus (200) having superconductor domains with even higher critical temperatures. For example, FIG. 10A shows the electrical resistance curve (1001) of a sample that had a phase transition at 80K that is indicative of a multi-domain sample having a superconducting domain with a critical temperature of 80K. Referring to FIG. 9, this superconducting domain is seen to have a stoichiometric loading ratio x~1.33. The electrical resistance curve of the sample of FIG. 10A was measured again 24 hours later, and resulted in curve (1010). The phase transition of a superconducting domain with a critical temperature of 80K is apparent in curve (1010), and indicates that the superconducting domain persisted in the sample for a period of at least 24 hours. The absolute resistance of curve (1010) is somewhat higher than the absolute resistance of curve (1001) because some of the hydrogen isotopes have been able to escape from the sample, thereby increasing its absolute resistance as shown in FIG. 4.

As shown in FIG. 10B, another sample had an electrical resistance curve (1002) with a phase transition at 82K that is indicative of a multi-domain sample having a superconducting domain with a critical temperature of 82K. The electrical resistance curve of this sample was measured again 24 hours later, and resulted in curve (1020) which shows the persistence of the superconducting domain with the critical temperature of 82K for a period of at least 24 hours. The absolute resistance of curve (1020) is somewhat higher than the absolute resistance of curve (1002) because some of the hydrogen isotopes have been able to escape from the sample, thereby increasing its absolute resistance as shown in FIG. 4.

Still other samples were produced with superconducting domains at even higher critical temperatures. FIG. 11A shows the electrical resistance measurements of a sample having a phase transition at 90K that is indicative of a multi-domain sample having a superconducting domain with a critical temperature of 90K. FIG. 11B shows the electrical resistance measurements of a sample having a phase transition at 100K that is indicative of a multi-domain sample having a superconducting domain with a critical temperature of 100K. And finally, FIG. 11C shows the electrical resistance measurements of a sample having a phase transition at 272.5 K that is indicative of a multi-domain sample having a superconducting domain with a critical temperature of 272.5K. For each of these samples, the length of the superconducting domain can be determined from the size of the resistance drop near the critical temperature using Eq. 6, and the stoichiometric loading ratio can be determined from the log-log plot of critical temperature versus stoichiometric ratio shown in FIG. 9.

While the invention has been described in terms of a method and apparatus for making a $Pd^yH_x$ sample having a stoichiometric loading ratio $x \geq 1$ using an electrochemical loading process in which hydrogen isotopes are loaded into a palladium lattice using a DC or AC current, other methods and apparatus for making the $Pd^yH_x$ sample are possible and within the scope of the invention. For example, the isotopic hydrogen loading can be done using a μs pulsed electrolysis technique in which a series of electrical pulses are supplied to electrolysis cell (201). The pulses can have rise times on the order of 50–500 nsec, widths on the order of 0.001 to 5.0 msec, peak currents of up to 6000 A, and repetition rates of up to 25 kHz.

In addition, other methods and apparatus can be used to load gas phase hydrogen isotopes into thin film palladium samples. These methods and apparatus allow homogeneous $PD^yH_x$ samples having large stoichiometric loading ratios $x \geq 1$ to be produced. Because the samples are homogeneous, the number of domains per sample can be small, and can even be as small as a single $Pd^yH_x$ domain. Thin film samples having a single domain with a high stoichiometric loading ratio x will have a single high-$T_c$ critical temperature. Thus, these samples will exhibit no appreciable resistance below the critical temperature, and will be able to conduct electricity below the critical temperature without electrical losses.

One method and apparatus for uniformly loading gas phase hydrogen isotopes onto a thin film palladium sample (203) is shown in FIG. 12. As shown in the figure, an ion gun is used to inject isotopic hydrogen into a thin film palladium sample. A source (1201) of isotopic hydrogen in the gas phase is delivered to a vacuum chamber (1202). The hydrogen isotopes are ionized by a high energy x-ray or other ionizing source (1203). The resulting hydrogen isotope cations are then accelerated toward a thin film palladium cathode (1204) where they are absorbed. The stoichiometric loading ratio of the thin film sample can be measured in real time by measuring the relative resistance of the sample. When the relative resistance indicates a desired stoichiometric loading ratio, a sealant (1205) capable of bonding to the loaded thin film palladium sample is deposited onto the surface of the sample using well known thin film deposition techniques. For example, the sealant can be deposited onto the surface of the sample using chemical vapor deposition and molecular beam epitaxy deposition techniques.

An alternative method and apparatus for uniformly loading gas phase hydrogen isotopes onto a thin film palladium sample is shown in FIG. 13. A thin film palladium sample (1301) is placed inside a pressure chamber (1302). The chamber is pressurized with a source of hydrogen isotopes in the gaseous phase to pressures up to 100 bar. The hydrogen isotopes dissolve into thin film palladium sample (1301). The stoichiometric loading ratio of the thin film sample can be measured in real time by measuring the relative resistance of the sample. When the relative resistance indicates a desired stoichiometric loading ratio, a sealant (1303) capable of bonding to the loaded thin film palladium sample is deposited onto the surface of the sample using well known thin film deposition techniques. For example, the sealant can be deposited onto the surface of the sample using chemical vapor deposition and molecular beam epitaxy deposition techniques.

A number of embodiments of the invention have been described. Nevertheless, it will be understood that various modifications may be made without departing from the spirit and scope of the invention. Accordingly, these and other embodiments of the invention are within the scope of the following claims.

What is claimed is:

1. A material comprising a palladium hydride having a chemical formula $Pd^yH_x$, wherein $^yH$ is $^1H$, $^2H$, or $^3H$ and wherein x is a stable stoichiometric ratio of $^yH$ to Pd that is greater than 1; and a stabilizing agent coating the palladium hydride to maintain the palladium hydride's stoichiometric ratio x>1.

2. The material of claim 1, wherein the stoichiometric ratio is stable over temperature variations from 4 degrees Kelvin to 400 degrees Kelvin.

3. The material of claim 1, wherein the stoichiometric ratio is stable over time periods of at least 24 hours.

4. The material of claim 1, wherein the stoichiometric ratio is stable down to pressures of 1 millibar.

5. The material of claim 1, wherein the stabilizing agent is a metal is bonded to the surface of the palladium hydride.

6. The material of claim 5, wherein the metal is mercury, aluminum, nickel, copper, gold, silver, platinum, zinc, steel, cadmium, or lead.

7. The material of claim 1, wherein the stabilizing agent is an insulator is bonded to the surface of the palladium hydride.

8. The material of claim 7, wherein the insulator is a polymer, ceramic, or metal oxide.

9. The material of claim 7, wherein the insulator is PTFE, nickel oxide, or copper oxide.

10. The material of claim 1, wherein the electrical resistance of the material exponentially drops off at a temperature that is a function of the stoichiometric ratio x.

11. A material having a domain comprising a Pd lattice loaded with $^yH$ such that the stoichiometric ratio x of $^yH$ to Pd in the domain is greater 1, wherein $^yH$ is $^1H$, $^2H$, or $^3H$; and a stabilizing agent coating the material to maintain the domain's stoichiometric ratio x>1.

12. The material of claim 11, wherein the stoichiometric ratio x of the domain is stable over temperature variations from 4 degrees Kelvin to 400 degrees Kelvin.

13. The material of claim 11, wherein the stoichiometric ratio x of the domain is stable over time periods of at least 24 hours.

14. The material of claim 11, wherein the stoichiometric ratio x of the domain is stable down to pressures of no less than 1 millibar.

15. The material of claim 11, wherein the stabilizing agent is a metal is bonded to the surface of the material.

16. The material of claim 15, wherein the metal is mercury, aluminum, nickel, copper, gold, silver, platinum, zinc, steel, cadmium, or lead.

17. The material of claim 11, wherein the stabilizing agent is an insulator is bonded to the surface of the material.

18. The material of claim 17, wherein the insulator is a polymer, ceramic, or metal oxide.

19. The material of claim 17, wherein the insulator is PTFE, nickel oxide, or copper oxide.

20. The material of claim 11, wherein the electrical resistance of the material exponentially drops off at a temperature that is a function of the stoichiometric ratio x.

21. A product made by loading a palladium lattice with a hydrogen isotope such that the stoichiometric ratio x of isotopic hydrogen to palladium is greater than 1 and by coating the product with a stabilizing agent to maintain the stoichiometric ratio greater than 1.

22. The product of claim 21, wherein the stoichiometric ratio of the domain is stable over temperature variations from 4 degrees Kelvin to 400 degrees Kelvin.

23. The product of claim 21, wherein the stoichiometric ratio of the domain is stable over time periods of at least 24 hours.

24. The product of claim 21, wherein the stoichiometric ratio of the domain is stable down to pressures of no less than 1 millibar.

25. The product of claim 21, wherein loading a palladium lattice with a hydrogen isotope and coating the product with a stabilizing agent comprises:
   adding a first electrolytic solution to an electrochemical cell having an anode and a palladium cathode, the first electrolytic solution having a first electrolyte and a pH that is less than 7;
   passing a current through the first electrolytic solution in the electrochemical cell;
   adding a second electrolyte to the first electrolytic solution to produce a second electrolytic solution, the second electrolyte having a cation that can bond to the palladium cathode; and
   passing a current through the second electrolytic solution in the electrochemical cell.

26. The product of claim 25, wherein the anode is made from a metal from the group consisting of platinum, nickel, tungsten, gold, copper, and titanium.

27. The product of claim 25, wherein the current is a direct current.

28. The product of claim 27, wherein the direct current has a current density between 1 and 1000 milliamperes per square centimeter.

29. The product of claim 25, wherein the current is an alternating current.

30. The product of claim 25, 27, or 29, wherein the current is a pulsed current.

31. The product of claim 25, wherein the first electrolyte has an anionic species that is chosen from the group consisting of sulfates, phosphates, chlorates, carbonates, borates, bromates, chromates, oxalates, nitrates, perchlorates, iodates, permanganates, acetates, sulfites, nitrites, and chlorites.

32. The product of claim 25, wherein the first electrolyte has a cationic species that is chosen from the group consisting of Sr, Be, Mg, Ca, Ba, Mn, Fe, Co, Ni, Cu, Zn, Cd, Sn, Ba, Ra, Sc, Ce and Pb.

33. The product of claim 25, wherein the first electrolytic solution is a strontium sulfate solution.

34. The product of claim 25, wherein the second electrolyte has a cationic species selected from the group consisting of mercury, copper, nickel, aluminum, gold, silver, platinum, steel, cadmium, lead and zinc.

35. The product of claim 25, wherein the second electrolyte is mercurous sulfate or mercuric sulfate.

36. The product of claim 25, wherein the second electrolyte has a metallic cation that can bond to the surface of the hydrogen loaded palladium cathode.

37. The product of claim 36, wherein the metallic cation is mercury, aluminum, nickel, copper, gold, silver, platinum, zinc, steel, cadmium, or lead.

38. The product of claim 25, wherein the second electrolyte bonds to the surface of the hydrogen loaded palladium cathode to form an insulating layer.

39. The product of claim 25, wherein the insulating layer is a polymer, ceramic, or metal oxide.

40. The product of claim 25, wherein the insulating layer is PTFE, nickel oxide, or copper oxide.

41. The product of claim 21, wherein the electrical resistance of the product exponentially drops off at a temperature that is a function of the stoichiometric ratio x.

42. A method for making a palladium hydride material having a stable hydrogen to palladium stoichiometric ratio x that is greater than 1, the method comprising chemically loading a hydrogen isotope onto a palladium lattice cathode in an electrochemical cell by:
   adding a first electrolytic solution to the cell, the first electrolytic solution having a first electrolyte and a pH that is less than 7;
   passing a current through the first electrolytic solution in the cell to load the palladium cathode with hydrogen;
   adding a second electrolyte to the first electrolytic solution to produce a second electrolytic solution, the second electrolyte having a cation that can bond to the palladium cathode; and
   passing a current through the second electrolytic solution in the cell to form a stabilizing agent on the palladium cathode.

43. The method of claim 42, wherein the electrochemical cell has an anode that is made from a metal from the group consisting of platinum, nickel, tungsten, gold, copper, and titanium.

44. The method of claim 42, wherein the current source is a direct current source, an alternating current source, or a pulsed current source.

45. The method of claim 42, wherein the first electrolyte has an anionic species that is chosen from the group consisting of sulfates, phosphates, chlorates, carbonates, borates, bromates, chromates, oxalates, nitrates, perchlorates, iodates, permanganates, acetates, sulfites, nitrites, and chlorites.

46. The method of claim 42, wherein the first electrolyte has a cationic species that is chosen from the group consisting of Sr, Be, Mg, Ca, Ba, Mn, Fe, Co, Ni, Cu, Zn, Cd, Sn, Ba, Ra, Sc, Ce and Pb.

47. The method of claim 42, wherein the first electrolytic solution is a strontium sulfate solution.

48. The method of claim 42, wherein the second electrolyte has a cationic species selected from the group consisting of mercury, copper, nickel, aluminum, gold, silver, platinum, steel, cadmium, lead and zinc.

49. The method of claim 42, wherein the second electrolyte is mercurous sulfate or mercuric sulfate.

50. A method for making a palladium hydride material having a stable hydrogen to palladium stoichiometric ratio x that is greater than 1, the method comprising:
    loading gas phase isotopic hydrogen into a thin film palladium lattice in a pressure chamber by pressurizing the chamber with the isotopic hydrogen gas; and
    depositing a stabilizing layer over the hydrogen loaded palladium lattice.

51. The method of claim 50, wherein the stabilizing layer is a metal, metal oxide, polymer or ceramic.

52. The method of claim 50, wherein the stabilizing layer is mercury, copper, nickel, aluminum, gold, silver, platinum, steel, cadmium, lead, zinc, or PTFE.

53. The method of claim 50, wherein the step of depositing a stabilizing layer over the hydrogen loaded palladium lattice comprises depositing the stabilizing layer using chemical vapor deposition or molecular beam epitaxy.

54. A method for making a palladium hydride material having a stable hydrogen to palladium stoichiometric ratio x that is greater than 1, the method comprising:
    generating a stream of hydrogen isotopes in the gas phase in an evacuated chamber;
    ionizing the stream of hydrogen isotopes;
    injecting the ionized hydrogen isotopes into a thin film palladium lattice by accelerating the isotopes toward the lattice; and
    depositing a stabilizing layer over the hydrogen loaded palladium lattice.

55. The method of claim 54, wherein the stabilizing layer is a metal, metal oxide, polymer or ceramic.

56. The method of claim 54, the stabilizing layer is mercury, copper, nickel, aluminum, gold, silver, platinum, steel, cadmium, lead, zinc, or PTFE.

57. The method of claim 54, wherein the step of depositing a stabilizing layer over the hydrogen loaded palladium lattice comprises depositing the stabilizing layer using chemical vapor deposition or molecular beam epitaxy.

* * * * *